(12) United States Patent
Lee et al.

(10) Patent No.: US 12,444,708 B2
(45) Date of Patent: Oct. 14, 2025

(54) SEMICONDUCTOR PACKAGE INCLUDING STACKED SEMICONDUCTOR CHIPS

(71) Applicant: SK hynix Inc., Icheon-si (KR)

(72) Inventors: Jong Joo Lee, Icheon-si (KR); Kyeong Min Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 653 days.

(21) Appl. No.: 17/730,715

(22) Filed: Apr. 27, 2022

(65) Prior Publication Data

US 2023/0139378 A1  May 4, 2023

(30) Foreign Application Priority Data

Nov. 3, 2021  (KR) .................. 10-2021-0149671

(51) Int. Cl.
*H01L 25/065* (2023.01)
*H01L 23/00* (2006.01)
*H01L 23/498* (2006.01)

(52) U.S. Cl.
CPC .... *H01L 25/0652* (2013.01); *H01L 23/49816* (2013.01); *H01L 24/16* (2013.01); *H01L 24/32* (2013.01); *H01L 24/33* (2013.01); *H01L 24/48* (2013.01); *H01L 24/49* (2013.01); *H01L 24/73* (2013.01); *H01L 2224/16225* (2013.01); *H01L 2224/3201* (2013.01); *H01L 2224/32145* (2013.01); *H01L 2224/32225* (2013.01); *H01L 2224/3303* (2013.01);
(Continued)

(58) Field of Classification Search
CPC ......... H01L 24/33; H01L 24/48; H01L 24/49; H01L 2224/3201; H01L 2224/32145; H01L 2224/32225; H01L 2224/3303; H01L 2224/4903; H01L 25/18; H01L 2225/06565; H01L 2225/06575; H01L 23/5383; H01L 23/5386; H01L 24/01; H01L 2224/01
See application file for complete search history.

(56) References Cited

U.S. PATENT DOCUMENTS

2018/0254261 A1* 9/2018 Park .................... H01L 25/0652
2022/0130797 A1* 4/2022 Kang ...................... H01L 21/32

FOREIGN PATENT DOCUMENTS

KR    1020180052351 A    5/2018

* cited by examiner

*Primary Examiner* — Ajay Ojha
*Assistant Examiner* — Sandra Milena Rodriguez Villanu
(74) *Attorney, Agent, or Firm* — WILLIAM PARK AND ASSOCIATES LTD.

(57) ABSTRACT

A semiconductor package may include: a substrate having a first side and a second side on a same plane; a first semiconductor chip disposed over the second side of the substrate; a first one-side third semiconductor chip stack disposed over the first side of the substrate and spaced apart from the first semiconductor chip; a second semiconductor chip stack disposed over the first semiconductor chip and the first one-side third semiconductor chip stack, the second semiconductor chip stack including one or more second semiconductor chips; and a second one-side third semiconductor chip stack disposed over the second semiconductor chip stack, wherein each of the third semiconductor chip stacks includes a plurality of third semiconductor chips that are offset-stacked, offset towards the first side as the third semiconductor chips are farther from the substrate, each of the third semiconductor chip stacks being electrically connected to the substrate.

18 Claims, 12 Drawing Sheets

(52) U.S. Cl.
CPC ........... *H01L 2224/48011* (2013.01); *H01L 2224/48148* (2013.01); *H01L 2224/48228* (2013.01); *H01L 2224/4903* (2013.01); *H01L 2224/73265* (2013.01); *H01L 2225/06506* (2013.01); *H01L 2225/0651* (2013.01); *H01L 2225/06517* (2013.01); *H01L 2225/06524* (2013.01); *H01L 2225/06562* (2013.01); *H01L 2924/1432* (2013.01); *H01L 2924/1433* (2013.01); *H01L 2924/1436* (2013.01); *H01L 2924/1438* (2013.01)

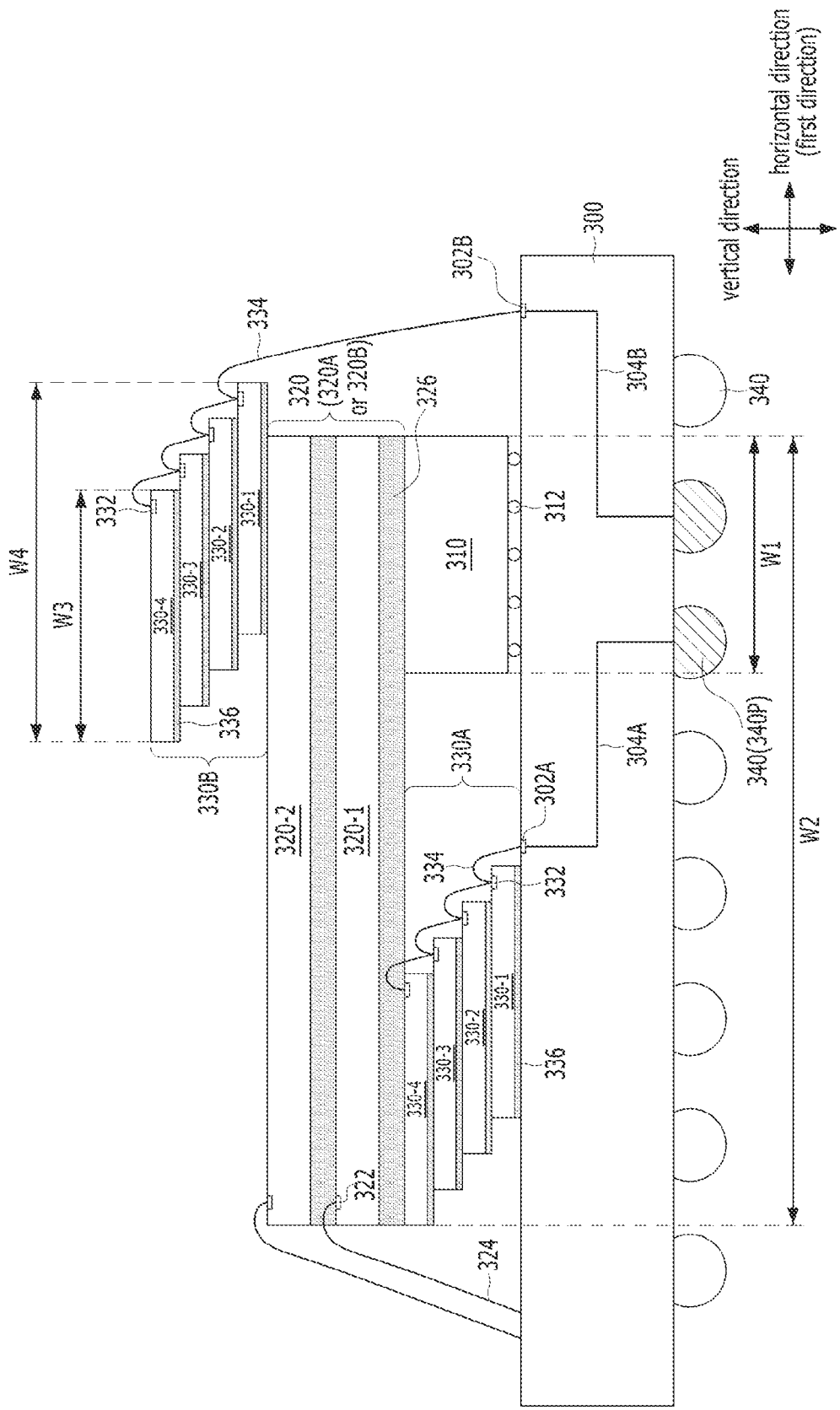

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2021-0149671 filed on Nov. 3, 2021, which is incorporated herein by reference in its entirety.

BACKGROUND

1. Technical Field

This patent document relates to a semiconductor technology, and more particularly, to a semiconductor package in which a plurality of semiconductor chips are stacked in a vertical direction.

2. Related Art

Electronic products require multifunctional and high-volume data processing while their sizes are getting smaller. Accordingly, a semiconductor package used for such an electronic product is required to include a plurality of semiconductor chips and to be made to a specified size or smaller.

Recently, a system in package (SIP) in which a memory and a memory controller are integrated together in one package has been proposed.

SUMMARY

In an embodiment, a semiconductor package may include: a substrate having a first side and a second side, the first and second sides being on opposite sides of the substrate in a first direction; a first semiconductor chip disposed over the substrate; a first one-side third semiconductor chip stack disposed over the substrate and spaced apart from the first semiconductor chip, the first one-side third semiconductor chip stack being closer to the first side than the first semiconductor chip; a second semiconductor chip stack disposed over the first semiconductor chip and the first one-side third semiconductor chip stack, the second semiconductor chip stack including one or more second semiconductor chips; and a second one-side third semiconductor chip stack disposed over the second semiconductor chip stack, wherein each of the first one-side third semiconductor chip stack and the second one-side third semiconductor chip stack includes a plurality of third semiconductor chips that are offset-stacked, offset towards the first side as the third semiconductor chips are farther from the substrate, so that chip pads that are disposed on other-side edge regions of the plurality of the third semiconductor chips are exposed, and wherein each of the first one-side third semiconductor chip stack and the second one-side third semiconductor chip stack is electrically connected to the substrate through a bonding wire extending to the substrate while connecting the chip pads of the plurality of third semiconductor chips to each other.

In another embodiment, a semiconductor package may include: a substrate having a first side and a second side, the first and second sides being on opposite sides of the substrate in a first direction; a first semiconductor chip disposed over the substrate; a first one-side third semiconductor chip stack disposed over the substrate and spaced apart from the first semiconductor chip, the first one-side third semiconductor chip stack being closer to the first side than the first semiconductor chip; a second semiconductor chip stack disposed over the first one-side third semiconductor chip stack, the second semiconductor chip stack including one or more second semiconductor chips; and a second one-side third semiconductor chip stack disposed over the first semiconductor chip, wherein each of the first one-side third semiconductor chip stack and the second one-side third semiconductor chip stack includes a plurality of third semiconductor chips that are offset-stacked, offset towards the first side as the third semiconductor chips are farther from the substrate, so that chip pads that are disposed on other-side edge regions of the plurality of the third semiconductor chips are exposed, and wherein each of the first one-side third semiconductor chip stack and the second one-side third semiconductor chip stack is electrically connected to the substrate through a bonding ire that extends to the substrate while connecting the chip pads of the plurality of third semiconductor chips to each other.

BRIEF DESCRIPTION OF THE DRAWINGS

FIG. 3A is a cross-sectional view illustrating a semiconductor package according to another embodiment of the present disclosure.

DETAILED DESCRIPTION

Figure 1:
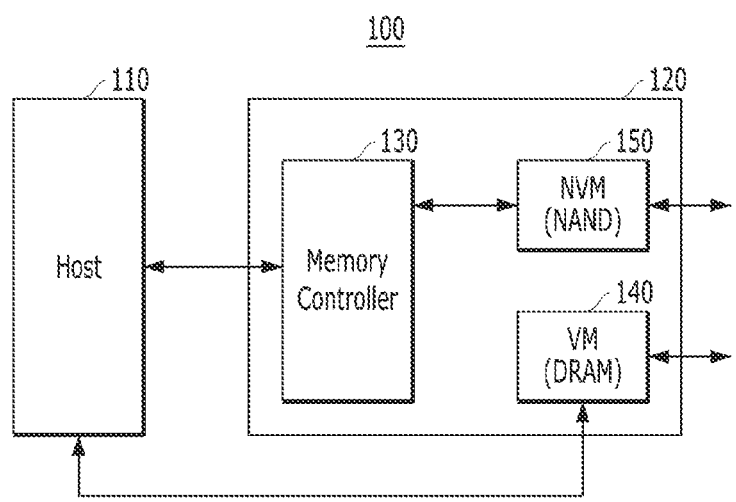
FIG. 1 is a view schematically illustrating an example of a data processing system including a memory system according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a view schematically illustrating an example of a data processing system including a memory system according to an embodiment of the present disclosure.

Referring to FIG. 1, a data processing system 100 may include a host 110 and a memory system 120.

The host 110 may include various wired and/or wireless electronic devices, such as a mobile phone, an MP3 player, a laptop computer, a desktop computer, a game console, a TV, and a projector. In addition, the host 110 may include at least one operating system (OS). This operating system may manage and control the functions and operations of the host 110 generally and may be executed in response to a request of a user by using the data processing system 100 or the memory system 120.

The memory system 120 may execute various operations in response to a request from the host 110. In particular, the memory system 120 may store data that is accessed by the host 110. That is, the memory system 120 may be used as a main memory device or an auxiliary memory device of the host 110.

The memory system 120 may include one or more memory devices, for example, first and second memory devices 140 and 150, and a memory controller 130. In the present embodiment, the operation of the first memory device 140 may be directly controlled by the host 110, and the operation of the second memory device 150 may be controlled by the memory controller 130.

The first memory device 140 may include volatile memory, such as dynamic random access memory (DRAM) and static random access memory (SRAM). The second memory device 150 may include nonvolatile memory, such as NAND flash, resistive random access memory (RRAM), phase-change random access memory (PRAM), magneto-resistive random access memory (MRAM), and ferroelectric random access memory (FRAM). In particular, in the present embodiment, the first memory device 140 may include DRAM and the second memory device 150 may include NAND flash. The non-volatile memory may be a memory having a relatively slow speed and a relatively large capacity and may perform a function of storing data or conserving the stored data for a long period of time. The volatile memory may be a memory having a relatively high speed and a relatively small capacity and may perform a function of temporarily storing data.

The memory controller 130 may control the second memory device 150 in response to a request from the host 110. As an example, the memory controller 130 may provide data that is read from the second memory device 150 to the host 110 or may store data that is provided from the host 110 in the second memory device 150. The memory controller 130 may include a central processing unit (CPU), a controller, an application specific integrated circuit (ASIC), an application processor (AP), or the like.

In order for the memory controller 130 to perform an operation, such as receiving a command from the host 110 or transferring data to the host 110, a signal may be transmitted between the memory controller 130 and the host 110. In addition, in order for the memory controller 130 to access the second memory device 150 to perform read/write/erase operations under the control of the processor, a signal may be transmitted between the memory controller 130 and the second memory device 150. In addition, in order for the host 110 to access the first memory device 140 to perform the operations, a signal may be transmitted between the host 110 and the first memory device 140. These signal transmission paths are indicated by an arrow between memory controller 130 and the host 110, an arrow between the memory controller 130 and the second memory device 150, and an arrow between the host 110 and the first memory device 140.

Also, in order for the first and second memory devices 140 and 150 to operate, power may be supplied to them. This power may include various levels of power voltage or ground voltage that required for each of the first and second memory devices 140 and 150. Accordingly, power may be supplied to each of the first memory device 140 and the second memory device 150 from an external device (not shown) that supplies power. These power supply paths are indicated by an arrow between the first memory device 140 and the external device and an arrow between the second memory device 150 and the external device.

In the data processing system 100 described above, the first memory device 140 may be implemented as one or more first memory chips, the second memory device 150 may be implemented as one or more second memory chips, different from the first memory chips, and the memory controller 130 may be implemented as one or more controller chips. Furthermore, the memory system 120 including the first memory device 140, the second memory device 150, and the memory controller 130 may be implemented as a single package. This will be described in more detail with reference to the following drawings.

Figure 2A:
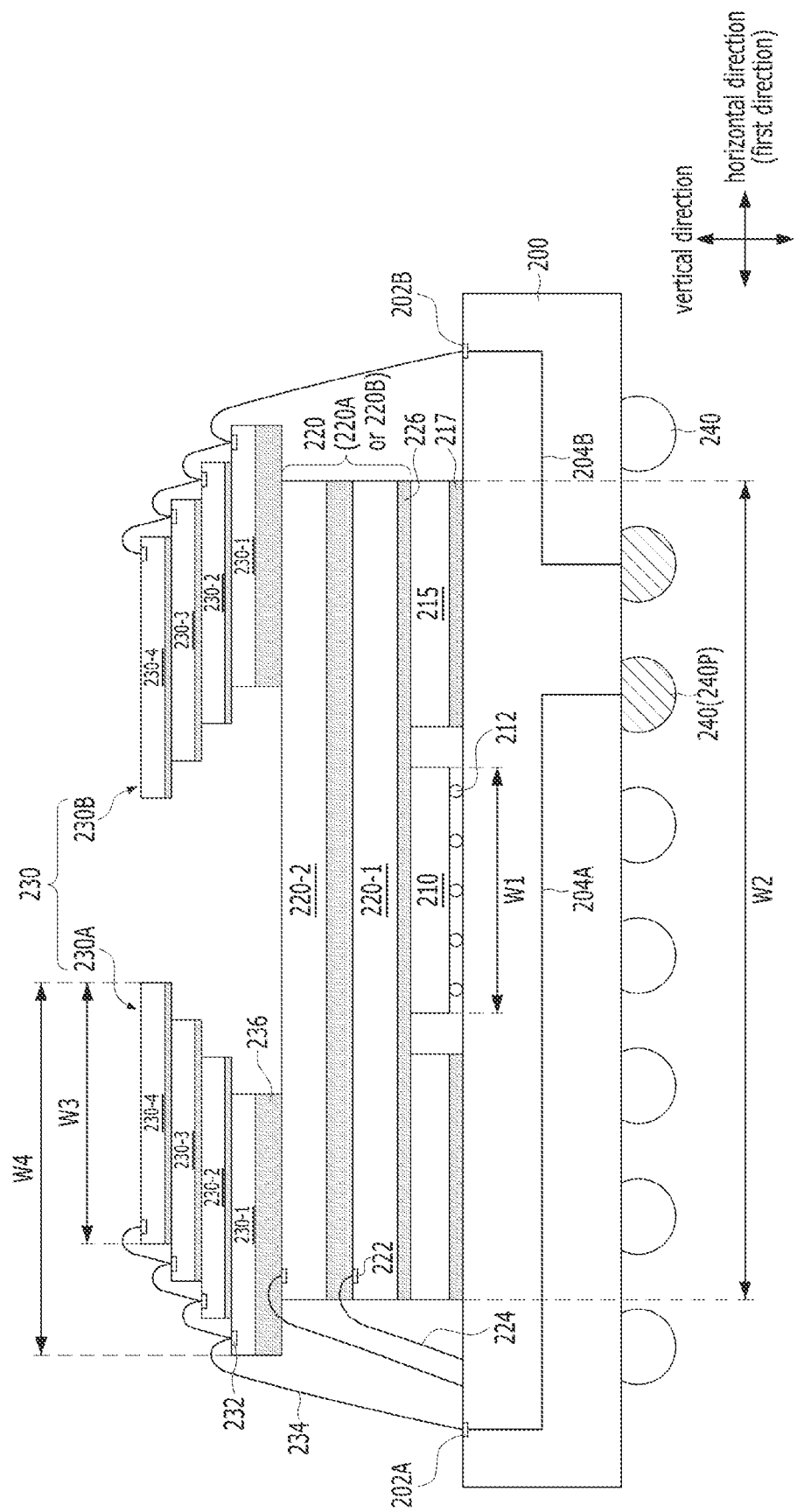
FIG. 2A is a cross-sectional view illustrating a semiconductor package according to an embodiment of the present disclosure.
Figure 2B:
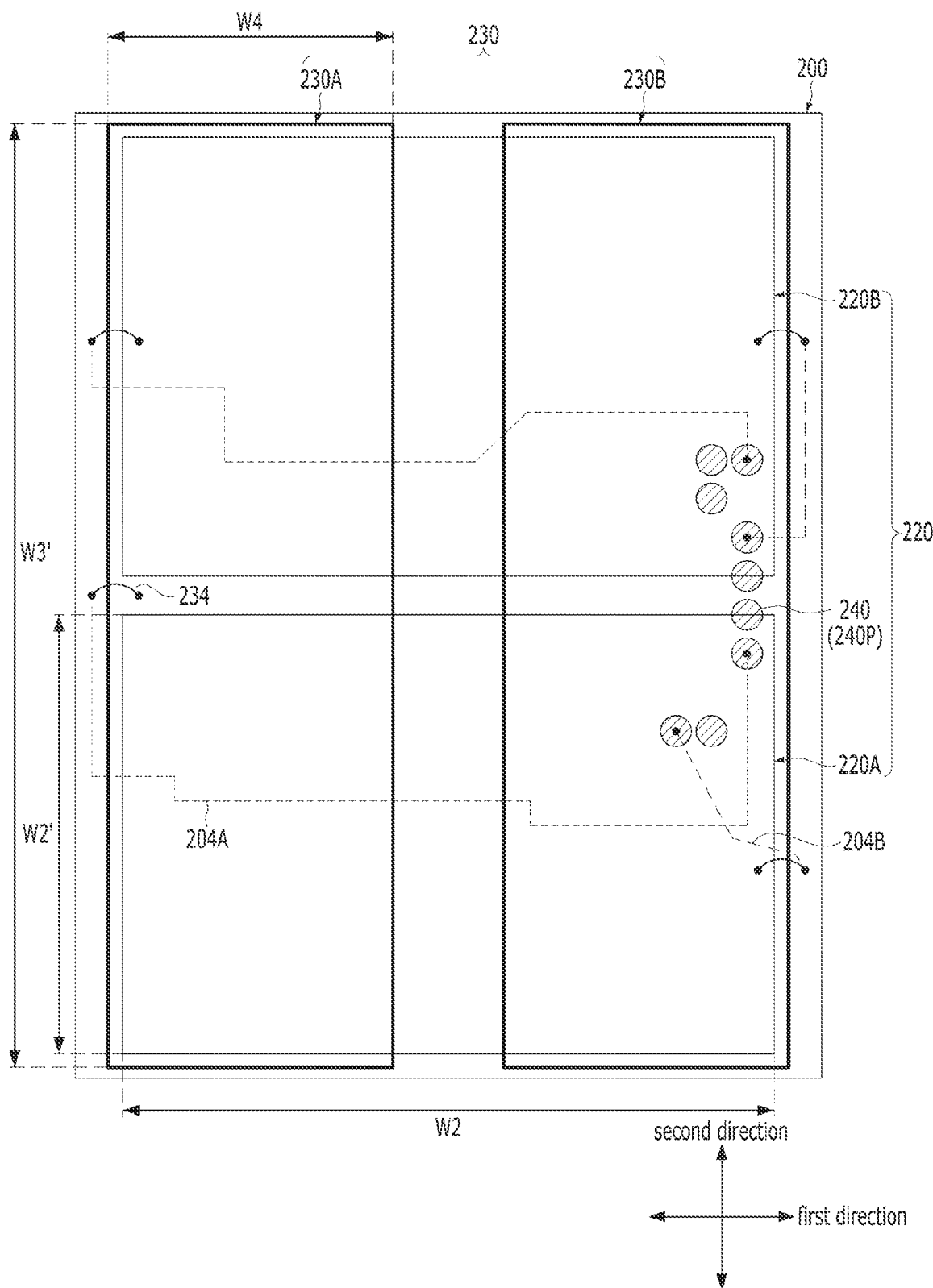
FIG. 2B is a plan view of FIG. 2A viewed from above.
Figure 2C:
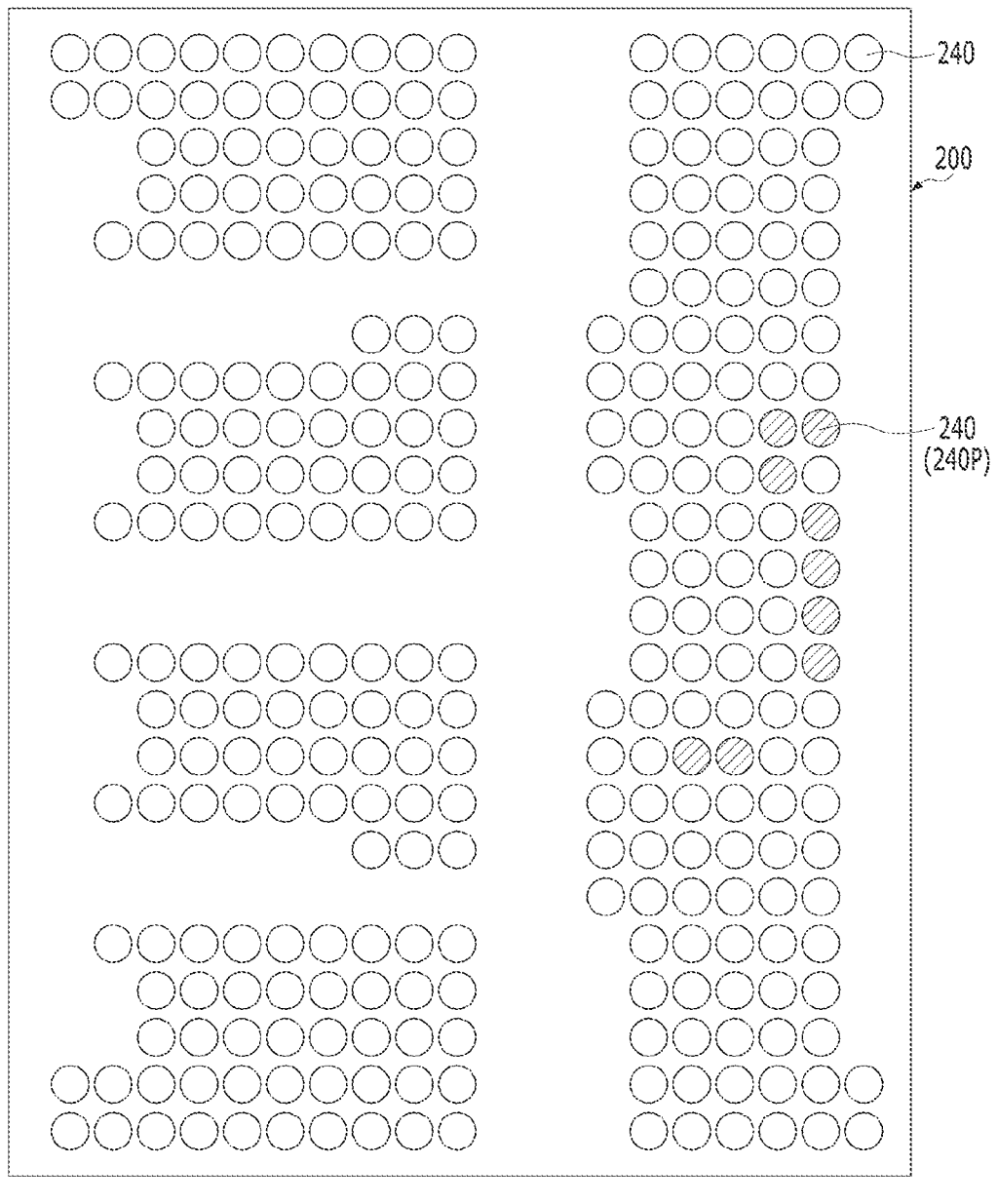
FIG. 2C is a view illustrating an arrangement of external connection electrodes of FIG. 2A in a plan view.

FIG. 2A is a cross-sectional view illustrating a semiconductor package according to an embodiment of the present disclosure, and FIG. 2B is a plan view of FIG. 2A viewed from above. FIG. 2A may correspond to a cross-sectional view of FIG. 2B in a first direction. FIG. 2C is a view illustrating an arrangement of external connection electrodes of FIG. 2A in a plan view. For convenience of description, in FIG. 2B, not only a substrate 200 and a third semiconductor chip stack 230, but also a second semiconductor chip stack 220, that is positioned below the third semiconductor chip stack 230 and partially covered by the third semiconductor chip stack 230, is shown. In addition, FIG. 2B also shows a power connection electrode 240P, among the external connection electrodes 240 of FIG. 2C, serving to supply power to the third semiconductor chip stack 230. For reference, because the external connection electrodes 240 are schematically illustrated in FIG. 2A and the exact arrangement of the external connection electrodes 240 is not shown in FIG. 2A, the arrangement of the external connection electrodes 240 of FIG. 2A might not match that of FIGS. 2B and 2C. The arrangement of the external connection electrodes 240 in a plan view will be described with reference to FIGS. 2B and 2C.

First, referring to FIGS. 2A and 2B, the semiconductor package of the present embodiment may include a substrate 200, a first semiconductor chip 210, a second semiconductor chip stack 220, a third semiconductor chip stack 230, and an external connection electrode 240. The first semiconductor chip 210, the second semiconductor chip stack 220, and the third semiconductor chip stack 230 may be disposed over one surface, for example, an upper surface of the substrate 200 and may be stacked in a vertical direction. The external connection electrode 240 may be disposed over the other surface, for example, a lower surface of the substrate 200.

The substrate 200 may include a circuit and/or wiring structure for electrically connecting the first semiconductor chip 210, the second semiconductor chip stack 220, and the third semiconductor chip stack 230 to the external connection electrode 240. For example, the substrate 200 may include a printed circuit board (PCB), an interposer, a redistribution layer, or the like. Various upper substrate pads for connection with the first semiconductor chip 210, the second semiconductor chip stack 220, and the third semiconductor chip stack 230 may be disposed on the upper surface of the substrate 200, and various lower substrate pads for connection with the external connection electrode 240 may be disposed on the lower surface of the substrate 200. These upper substrate pads and lower substrate pads may be parts of the circuit and/or wiring structure of the substrate 200 or may be electrically connected to the circuit and/or wiring structure of the substrate 200. In the cross-sectional view of FIG. 2A, for convenience of description, only upper substrate pads 202A and 202B for supplying power by connecting with the third semiconductor chip stack 230 are illustrated. As will be described later, the third semiconductor chip stack 230 may include a first one-side third semiconductor chip stack 230A and a second one-side third semiconductor chip stack 230B that are disposed on a first side and a second side of the substrate 200, respectively, in the first direction. The upper substrate pads 202A and 202B may include a first one-side upper substrate pad 202A for supplying power to the first one-side third semiconductor chip stack 230A and a second one-side upper substrate pad 202B for supplying power to the second one-side third semiconductor chip stack 230B. In addition, in the cross-sectional view of FIG. 2A, for convenience of description, only a first one-side wiring structure 204A and a second one-side wiring structure 204B, respectively connected to the first one-side upper substrate pad 202A and the second one-side upper substrate pad 202B, are illustrated in the substrate 200. Each of the first one-side and the second one-side wiring structures 204A and 204B may be formed based on a combination of various conductive patterns that extend in the vertical and/or horizontal directions so as to be connected from each of the first one-side and the second one-side upper substrate pads 202A and 2023 to the corresponding power connection electrode 240P. The conductive pattern that extends in the vertical direction may be, for example, a conductive via, and the conductive pattern that extends in the horizontal direction may be, for example, a conductive trace or a conductive plate.

The first semiconductor chip 210 may be disposed over the upper surface of the substrate 200 and may be connected to the substrate 200 based on a flip chip bonding method in which a connection electrode 212 that is formed over the lower surface of the first semiconductor chip 210 directly contacts the upper surface of the substrate 200. The connection electrode 212 may have various shapes, such as a column shape, a ball shape, or a combination thereof, and may include various conductive materials, such as a solder material, a metal material, or a combination thereof. However, the present disclosure is not limited thereto, and the first semiconductor chip 210 may be electrically connected to the substrate 200 through various interconnectors, such as bonding wires.

The first semiconductor chip 210 may correspond to a controller chip for controlling the second semiconductor chip stack 220 and/or the third semiconductor chip stack 230. As an example, when the second semiconductor chip stack 220 and the third semiconductor chip stack 230 include memory chips, the first semiconductor chip 210 may correspond to the memory controller 130 of FIG. 1, described above.

The second semiconductor chip stack 220 may be disposed over the first semiconductor chip 210. The second semiconductor chip stack 220 may include one or more second semiconductor chips 220-1 and 220-2, stacked in the vertical direction. In the present embodiment, a case in which two second semiconductor chips 220-1 and 220-2 are stacked is illustrated, but the present disclosure is not limited thereto, and the number of second semiconductor chips stacked in the vertical direction may be variously modified on the assumption that one or more second semiconductor chips are included in the second semiconductor chip stack 220. That is, the second semiconductor chip stack 220 may include only a single second semiconductor chip.

The second semiconductor chips 220-1 and 220-2 may be the same chips, in particular, the same memory chips. As an example, each of the second semiconductor chips 220-1 and 220-2 may be a volatile memory chip, such as DRAM. That is, each of the second semiconductor chips 220-1 and 220-2 may correspond to the first memory device 140 of FIG. 1, described above. When the second semiconductor chips 2204 and 220-2 are the same chips, they may have the same size in the horizontal direction and the same thickness in the vertical direction.

In the present embodiment, the second semiconductor chips 220-1 and 220-2 may be stacked in a state in which an active surface on which a chip pad 222 is disposed faces upward and an inactive surface faces downward, that is, in a face-up state. Also, the second semiconductor chips 220-1 and 220-2 may be arranged so that side surfaces thereof are aligned with each other. The chip pad 222 may be disposed on a first one-side edge region, for example, on a left edge region, of each of the second semiconductor chips 220-1 and 220-2, in the first direction, and may be electrically connected to the substrate 200 through a bonding wire 224. However, the present disclosure is not limited thereto, and the stacked form of the second semiconductor chips 220-1 and 220-2, the arrangement of the chip pads 222, an interconnect that connects the substrate 200 to the second semiconductor chips 220-1 and 220-2, or the like may be variously modified.

Each of the second semiconductor chips 220-1 and 220-2 may be attached to the upper surface of the second semiconductor chip 220-1 or the first semiconductor chip 210 that is positioned directly thereunder through an adhesive layer 226 that is formed over the inactive surface thereof. The adhesive layer 226 may include an insulating adhesive material, such as a die attach film (DAF). The adhesive layer 226 that is under the upper second semiconductor chip 220-2 may be thick enough to cover the peak of the bonding wire 224 that is connected to the chip pad 222 of the lower second semiconductor chip 220-1. For example, the adhesive layer 226 that is under the upper second semiconductor chip 220-2 may have a greater thickness than the adhesive layer 226 that is under the lower second semiconductor chip 220-1.

One or more second semiconductor chip stacks 220 may be arranged to be spaced apart from each other in the horizontal direction. As an example, as shown in the plan view of FIG. 2B the two second semiconductor chip stacks 220 may be arranged in a second direction that is substantially perpendicular to the first direction. The first of the two second semiconductor chip stacks 220 that is disposed on a first side in the second direction, for example, on a lower side in the plan view of FIG. 2B, may be referred to as a first one-side second semiconductor chip stack 220A, and the second of the two second semiconductor chip stacks 220 that is disposed on a second side in the second direction, for example, on an upper side in the plan view of FIG. 2B, may be referred to as a second one-side second semiconductor chip stack 220B. However, the present disclosure is not limited thereto, and the number and arrangement of the second semiconductor chip stack 220 may be variously modified.

The first one-side second semiconductor chip stack 220A and the second one-side second semiconductor chip stack 220B may be connected to different channels. Here, the channel may mean an independent path for transmitting a signal, such as a command or data to a corresponding semiconductor chip or semiconductor chip stack. In addition, the plurality of second semiconductor chips 220-1 and 220-2 that are included in the first one-side second semiconductor chip stack 220A may be connected to different channels or may be connected to the same channel. Similarly, the plurality of second semiconductor chips 220-1 and 220-2 that are included in the second one-side second semiconductor chip stack 220B may be connected to different channels or may be connected to the same channel.

The second semiconductor chip stack 220 may have a width that corresponds to W2 in the first direction and a width that corresponds to W2' in the second direction. As in the present embodiment, when the second semiconductor chips 220-1 and 220-2 have side surfaces that are aligned with each other, each of the second semiconductor chips 220-1 and 220-2 may have a width that corresponds to W2 in the first direction and a width that corresponds to W2' in the second direction. If the second semiconductor chips 220-1 and 220-2 do not have side surfaces that are aligned with each other, each of the second semiconductor chips 220-1 and 220-2 may have a width that is less than W2 in the first direction and/or a width that is less than W2' in the second direction. In any case, the area that is occupied by the second semiconductor chip stack 220 in the horizontal direction may be greater than the area of the first semiconductor chip 210. As an example, as shown in the cross-sectional view of FIG. 2A, in the first direction, the width W1 of the first semiconductor chip 210 may be less than the width W2 of the second semiconductor chip stack 220. For this reason, a leaning phenomenon in which the second semiconductor chip stack 220 is inclined over the first semiconductor chip 210 may occur. To prevent this phenomenon, a dummy semiconductor chip 215 may be further disposed in a space between the substrate 200 and the second semiconductor chip stack 220 and may be adjacent to the first semiconductor chip 210. The dummy semiconductor chip 215 might not electrically perform any function and might not be electrically connected to other components. The dummy semiconductor chip 215 may simply support the second semiconductor chip stack 220 that is under the second semiconductor chip stack 220. Although this figure illustrates a case in which two dummy semiconductor chips 215 are disposed on both sides of the first semiconductor chip 210 in the first direction, the present disclosure is not limited thereto, and the number and position of dummy semiconductor chips 215 may be variously modified. The dummy semiconductor chip 215 may be attached to the upper surface of the substrate 200 by an adhesive layer 217 that is formed over the lower surface thereof. The total thickness of the dummy semiconductor chip 215 and the adhesive layer 217 may be substantially the same as the total thickness of the first semiconductor chip 210 and the connection electrode 212. Accordingly, in the vertical direction, the upper surface of the dummy semiconductor chip 215 and the upper surface of the first semiconductor chip 210 may be positioned at substantially the same level. The adhesive layer 226 that is under the lower second semiconductor chip 220-1 may be attached to the upper surface of the dummy semiconductor chip 215 and the upper surface of the first semiconductor chip 210 that are positioned at the same level.

The third semiconductor chip stack 230 may be disposed over the second semiconductor chip stack 220. The third semiconductor chip stack 230 may include a plurality of third semiconductor chips 230-1 to 230-4 that are stacked in the vertical direction. In the present embodiment, a case in which four third semiconductor chips 2304 to 230-4 are stacked is illustrated, but the present disclosure is not limited thereto, and the number of third semiconductor chips stacked in the vertical direction may be variously modified.

The third semiconductor chips 230-1 to 230-4 may be the same chips, in particular, the same memory chips. As an example, each of the third semiconductor chips 230-1 to 230-4 may be a nonvolatile memory chip, such as NAND flash. That is, each of the third semiconductor chips 230-1 to 230-4 may correspond to the second memory device 150 of FIG. 1, described above. When the third semiconductor chips 230-1 to 230-4 are the same chips, they may have the same size in the horizontal direction and the same thickness in the vertical direction. However, the present disclosure is not limited thereto, and the thicknesses of the third semiconductor chips 230-1 to 230-4 may be different from each other in the vertical direction. For example, the thickness of the lowermost third semiconductor chip 230-1 may be greater than the thickness of each of the remaining third semiconductor chips 230-2 to 230-4.

Here, at least two third semiconductor chip stacks 230 may be arranged to be spaced apart from each other in a horizontal direction. As an example, the two third semiconductor chip stacks 230 may be arranged in the first direction. One of the two third semiconductor chip stacks 230 that is disposed on a first side, for example, on a left side in the first direction, may be referred to as a first one-side third semiconductor chip stack 230A, and the other of the two third semiconductor chip stacks 230 that is disposed on a second side, for example, on a right side in the first direction, may be referred to as a second one-side third semiconductor chip stack 230B. The first one-side third semiconductor chip stack 230A and the second one-side third semiconductor chip stack 230B may be connected to different channels.

In each of the first and second third semiconductor chip stacks 230A and 230B, the third semiconductor chips 230-1 to 230-4 may be stacked in a state in which an active surface on which a chip pad 232 is disposed faces upward and an inactive surface faces downward, that is, in a face-up state.

Here, the chip pad 232 of the first one-side third semiconductor chip stack 230A may be disposed on a first one-side edge region, for example, on a left edge region of each of the third semiconductor chips 230-1 to 230-4 in the first direction. Although not shown, a plurality of chip pads 232 may be arranged along the second direction in the first one-side edge region. The third semiconductor chips 230-1 to 230-4 of the first one-side third semiconductor chip stack 230A may be stacked so that all of the chip pads 232 are exposed. For example, the third semiconductor chips 230-1 to 230-4 of the first one-side third semiconductor chip stack 230A may be stacked to have a predetermined offset from a first side, for example, from a left side, on which the chip pad 232 is disposed toward a second side, for example, toward a right side, as the third semiconductor chips, among the first one-side third semiconductor chip stack 230A, are farther from the substrate 200. The first one-side third semiconductor chip stack 230A may be electrically connected to the substrate 200 through a bonding wire 234 that connects the exposed chip pads 232 of the third semiconductor chips 230-1 to 230-4 with each other and connects the chip pad 232 of the lowermost third semiconductor chip 230-1 to the first one-side upper substrate pad 202A.

On the other hand, the chip pad 232 of the second one-side third semiconductor chip stack 230B may be disposed on a second one-side edge region, for example, on a right edge region of each of the third semiconductor chips 230-1 to 230-4 in the first direction. Although not shown, a plurality of chip pads 232 may be arranged along the second direction in the second one-side edge region. The third semiconductor chips 230-1 to 230-4 of the second one-side third semiconductor chip stack 230B may be stacked so that all of the chip pads 232 are exposed. For example, the third semiconductor chips 230-1 to 230-4 of the second one-side third semiconductor chip stack 230B may be stacked to have a predetermined offset from the second side, for example, from a right side, on which the chip pad 232 is disposed toward a first side, for example, toward a left side, as the third semiconductor chips, among the first one-side third semiconductor chip stack 230A, are farther from the substrate 200. The second one-side third semiconductor chip stack 230B may be substantially mirror the first one-side third semiconductor chip stack 230A along a vertical axis between the two third semiconductor chip stacks 230. The second one-side third semiconductor chip stack 230B may be electrically connected to the substrate 200 through the bonding wire 234 that connects the exposed chip pads 232 of the third semiconductor chips 230-1 to 230-4 with each other and connects the chip pad 232 of the lowermost third semiconductor chip 230-1 to the second one-side upper substrate pad 202B.

Each of the third semiconductor chips 230-1 to 230-4 may be attached to the upper surface of the second semiconductor chip stack 220 or one of the third semiconductor chips 230-1 to 230-3, positioned directly thereunder through an adhesive layer 236, formed over the inactive surface thereof. The adhesive layer 236 may include an insulating adhesive material, such as DAF. The adhesive layer 236 that is under the lowermost third semiconductor chip 230-1 may be thick enough to cover the peak of the bonding wire 224 that is connected to the chip pad 222 of the upper second semiconductor chip 220-2. For example, the adhesive layer 236 that is under the lowermost third semiconductor chip 230-1 may have a greater thickness than the adhesive layer 236 that is under each of the remaining third semiconductor chips 230-2 to 230-4.

The third semiconductor chip stack 230 may have a width that corresponds to W4 in the first direction and a width that corresponds to W3' in the second direction. In the present embodiment, the third semiconductor chips 230-1 to 230-4 may be offset-stacked in the first direction to have side surfaces that are not aligned with each other, while, in the second direction, having side surfaces aligned with each other. In this case, each of the third semiconductor chips 230-1 to 230-4 may have a width that corresponds to W3 that is less than W4 in the first direction and a width that corresponds to W3' in the second direction. If the third semiconductor chips 230-1 to 230-4 have side surfaces that are not aligned with each other even in the second direction, each of the third semiconductor chips 2304 to 230-4 may have a width that is less than W3' in the second direction. In any case, the width W4 of the third semiconductor chip stack 230 may be less than the width W2 of the second semiconductor chip stack 220 in the first direction. Furthermore, the width W3' of the third semiconductor chip stack 230 may be greater than the width W2' of the second semiconductor chip stack 220 in the second direction. As an example, as shown in the cross-sectional view of FIG. 2A and the plan view of FIG. 2B, twice the width W4 of the third semiconductor chip stack 230 may be equal to or less than the width W2 of the second semiconductor chip stack 220 in the first direction, and the width W3' of the third semiconductor chip stack 230 may be equal to or greater than twice the width W2' of the second semiconductor chip stack 220 in the second direction.

A plurality of external connection electrodes 240 may be disposed over the lower surface of the substrate 200. The external connection electrode 240 may have various shapes, such as a column shape, a ball shape, or a combination thereof, and may include various conductive materials, such as a solder material, a metal material, or a combination thereof.

According to the semiconductor package described above, it may be possible to reduce the area and thickness of the package as much as possible while integrating different types of memories and controllers into one package.

Meanwhile, in a plan view, the arrangement of the external connection electrodes 240 in the semiconductor package is exemplarily shown in FIG. 2C.

Referring to FIG. 2C, the external connection electrodes 240 may be arranged in the first direction and the second direction. Each of the external connection electrodes 240 may function as a terminal for exchanging a signal with an external device or supplying power from the external device. In particular, some of the external connection electrodes 240, which supply power to the third semiconductor chips 230-1 to 230-4, may be hatched with diagonal lines and are referred to as power connection electrodes 240P.

In this case, the arrangement of the external connection electrodes 240 or the function of each external connection electrode 240 may be in a fixed state according to a predetermined ball map. According to this ball map, the power connection electrodes 240P for supplying power to the NAND flash that can be used as the third semiconductor chips 230-1 to 230-4 may be disposed relatively biased to the second side, for example, to the right side, in the first direction. In other words, the power connection electrodes 240P may be disposed closer to the second side, for example, the right side, than the first side, for example, the left side, of the substrate 200 in the first direction.

Referring to FIGS. 2A and 2B again, because the power connection electrodes 240P are relatively disposed on the second side, for example, on the right side, in the first direction, the length of the first one-side wiring structure 204A may be greater than the length of the second one-side wiring structure 204B. The length of the first one-side wiring structure 204A may be a distance from the first one-side upper substrate pad 202A that is connected to the first one-side third semiconductor chip stack 230A through the bonding wire 234 to a first corresponding power connection electrode, among the power connection electrodes 240P, and the length of the second one-side wiring structure 204B may be a distance from the second one-side upper substrate pad 202B that is connected to the second one-side third semiconductor chip stack 230B through the bonding wire 234 to a second corresponding power connection electrode, among the power connection electrodes 240P.

As a result, because it is relatively difficult to supply power to the first one-side third semiconductor chip stack 230A that is located relatively far from the power connection electrode 240P, power integrity may deteriorate.

In addition, because the one-side wiring structure 204A having a relatively long length in the substrate 200 must avoid other wiring structures, it may be difficult to design a circuit/wiring structure in the substrate 200.

Hereinafter, embodiments that can further improve the performance of the semiconductor memory of FIGS. 2A and 2B and facilitate the design of the substrate 200 will be proposed.

Figure 3B:
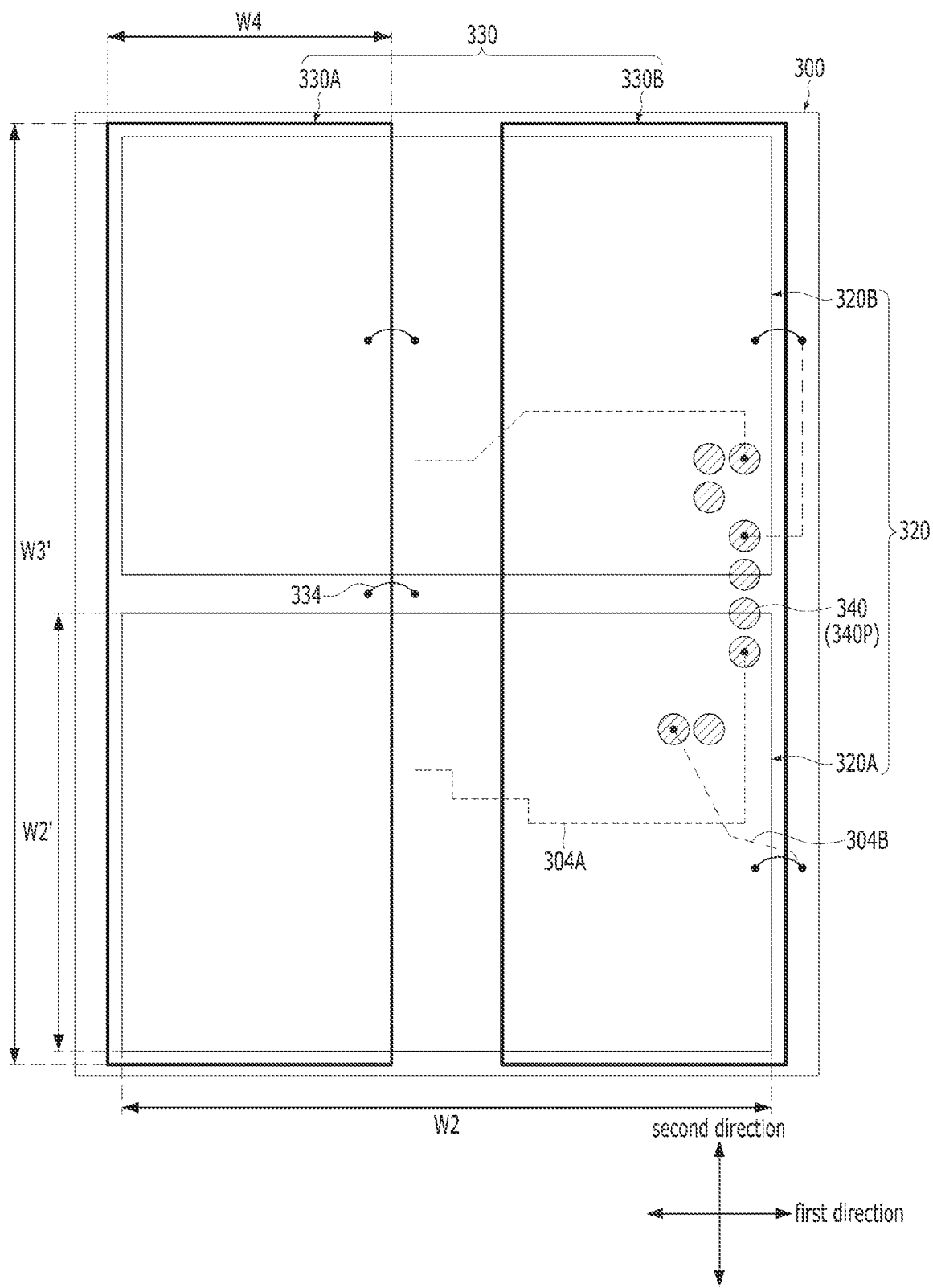
FIG. 3B is a plan view of FIG. 3A viewed from above.

FIG. 3A is a cross-sectional view illustrating a semiconductor package according to another embodiment of the present disclosure, and FIG. 3B is a plan view of FIG. 3A viewed from above. For convenience of description, FIG. 3B shows not only a substrate 300 and a second one-side third semiconductor chip stack 330B, but also a second semiconductor chip stack 320 and a first one-side third semiconductor chip stack 330A of which at least a portion is covered. Differences from the aforementioned embodiment of FIGS. 2A and 2B will be mainly described.

Referring to FIGS. 3A and 3B, the semiconductor package of the present embodiment may include a substrate 300, a first semiconductor chip 310, a second semiconductor chip stack 320, third semiconductor chip stacks 300A and 300B including a first one-side third semiconductor chip stack 330A and a second one-side third semiconductor chip stack 330B, and external connection electrodes 340 including power connection electrodes 340P.

The substrate 300 may include a first one-side upper substrate pad 302A for supplying power to the first one-side third semiconductor chip stack 330A and a second one-side upper substrate pad 302B for supplying power to the second one-side third semiconductor chip stack 330B. Also, the substrate 300 may include a first one-side wiring structure 304A that is connected from the first one-side upper substrate pad 302A to a first corresponding power connection electrode, among the power connection electrodes 340P, and a second one-side wiring structure 304B connected from the second one-side upper substrate pad 302B to a second corresponding power connection electrode, among the power connection electrodes 340P.

The first semiconductor chip 310 may be disposed over the upper surface of the substrate 300 and may be connected to the substrate 300 by a connection electrode 312 that is formed on the lower surface of the first semiconductor chip 310. The first semiconductor chip 310 may be disposed to be relatively biased toward the second side, for example, to the right side in the first direction. In other words, the first semiconductor chip 310 may be disposed closer to the second side, for example, the right side, rather than the first side, for example, the left side, of the substrate 300 in the first direction. This may be to provide a space in which the first one-side third semiconductor chip stack 330A is disposed on the first side, for example, on the left side of the first semiconductor chip 310. The structure and location of the first one-side third semiconductor chip stack 330A will be described later.

The second semiconductor chip stack 320 may be disposed over the first semiconductor chip 310 and the first one-side third semiconductor chip stack 330A. The second semiconductor chip stack 320 may include one or more second semiconductor chips 320-1 and 320-2, stacked in the vertical direction. Each of the second semiconductor chips 320-1 and 320-2 may be attached to the upper surface of the second semiconductor chip 320-1 or the first semiconductor chip 310, positioned directly thereunder through an adhesive layer 326, formed over the inactive surface thereof. The second semiconductor chips 320-1 and 320-2 may be electrically connected to the substrate 300 through a bonding wire 324 that is connected to the chip pad 322. The second semiconductor chip stack 320 may include a first one-side second semiconductor chip stack 320A and a second one-side second semiconductor chip stack 320B, which are arranged to be spaced apart from each other in the second direction.

The first one-side third semiconductor chip stack 330A of the third semiconductor chip stack 330 may be disposed between the substrate 300 and the second semiconductor chip stack 320 in the vertical direction. That is, the first one-side third semiconductor chip stack 330A may be positioned at the same level as the first semiconductor chip 310 in the vertical direction. The first one-side third semiconductor chip stack 330A may have a thickness that is substantially equal to the sum of the thicknesses of the first semiconductor chip 310 and the connection electrode 312, and thus, the upper surface of the first one-side third semiconductor chip stack 330A and the upper surface of the first semiconductor chip 310 may be positioned at substantially the same level in the vertical direction. The first one-side third semiconductor chip stack 330A may be disposed to be spaced apart from the first semiconductor chip 310 on a first side, for example, on the left side of the first semiconductor chip 310 in the first direction.

On the other hand, the second one-side third semiconductor chip stack 330B may be disposed over the second semiconductor chip stack 320. In the first direction, the second one-side third semiconductor chip stack 330B may be disposed to be closer to the second side of the substrate 300 than the first one-side third semiconductor chip stack 330A. As an example, the second one-side third semiconductor chip stack 330B may be disposed to overlap with the first semiconductor chip 310.

Each of the first one-side and the second one-side third semiconductor chip stacks 330A and 330B may include one or more third semiconductor chips 330-1 to 330-4, stacked in the vertical direction. The third semiconductor chips 330-1 to 330-4 may be stacked in a state in which an active surface on which a chip pad 332 is disposed faces upward and an inactive surface faces downward, that is, in a face-up state. In addition, the chip pad 332 of the first one-side and the second one-side third semiconductor chip stacks 330A and 330B may be disposed on a second one-side edge region, for example, a right edge region of each of the third semiconductor chips 330-1 to 330-4 in the first direction. The third semiconductor chips 330-1 to 330-4 of the first one-side and the second one-side third semiconductor chip stacks 330A and 330B may be stacked so that all of the chip pads 332 are exposed. For example, in each of the first one-side and the second one-side third semiconductor chip stacks 330A and 330B, the third semiconductor chips 330-1 to 330-4 may be stacked to have a predetermined offset from the second side, for example, from the right side on which the chip pad 332 is disposed toward the first side, positioned on the opposite side of the second side, for example, toward the left side in the first direction. That is, the offset stacking direction of the third semiconductor chips 330-1 to 330-4 in the first one-side third semiconductor chip stack 330A may be identical to the offset stacking direction of the third semiconductor chips 330-1 to 330-4 in the second one-side third semiconductor chip stack 330B. The first one-side third semiconductor chip stack 330A may be electrically connected to the substrate 300 through a bonding wire 334 that connects the exposed chip pads 332 of the third semiconductor chips 330-1 to 330-4 with each other and connects the chip pad 332 of the lowermost third semiconductor chip 330-1 to the first one-side upper substrate pad 302A. The second one-side third semiconductor chip stack 330B may be electrically connected to the substrate 300 through the bonding wire 334 that connects the exposed chip pads 332 of the third semiconductor chips 330-1 to 330-4 with each other and connects the chip pad 332 of the lowermost third semiconductor chip 330-1 to the second one-side upper substrate pad 302B. Each of the third semiconductor chips 330-1 to 330-4 may be attached to a component that is positioned directly thereunder through an adhesive layer 336 that is formed over the inactive surface thereof.

According to the semiconductor package described above, because the first one-side third semiconductor chip stack 330A is positioned below the second semiconductor chip stack 320, and the chip pad 332 of the first one-side third semiconductor chip stack 330A and the bonding wire 334 that is connected thereto are disposed relatively close to the second side, for example, to the right side, the length of the first one-side wiring structure 304A may be reduced. The length of the first one-side wiring structure 304A may be a distance from the first one-side upper substrate pad 302A connected to the first one-side third semiconductor chip stack 330A through the bonding wire 334 to a corresponding power connection electrode 340P.

As a result, power supply to the first one-side third semiconductor chip stack 330A may be facilitated, and the power integrity may be improved.

In addition, because the area that is occupied by the first one-side wiring structure 304A in the substrate 300 is reduced, the degree of freedom in designing the circuit/wiring structure in the substrate 300 may be increased.

In addition, because the distance between the first one-side third semiconductor chip stack 330A and the first semiconductor chip 310 is also reduced, the integrity of signals that are exchanged therebetween through the substrate 300 may be improved.

Furthermore, because the first one-side third semiconductor chip stack 330A supports the second semiconductor chip stack 320 together with the first semiconductor chip 310, the number of required dummy semiconductor chips may be reduced or the dummy semiconductor chips might not be needed.

Meanwhile, the first semiconductor chip 310, the second semiconductor chip stack 320, and the third semiconductor chip stack 330 may be arranged in various shapes depending on the area and/or size in a plan view, and as necessary, one or more dummy semiconductor chips for supporting may be further used. This will be exemplarily described with further reference to FIG. 3C.

Figure 3C:
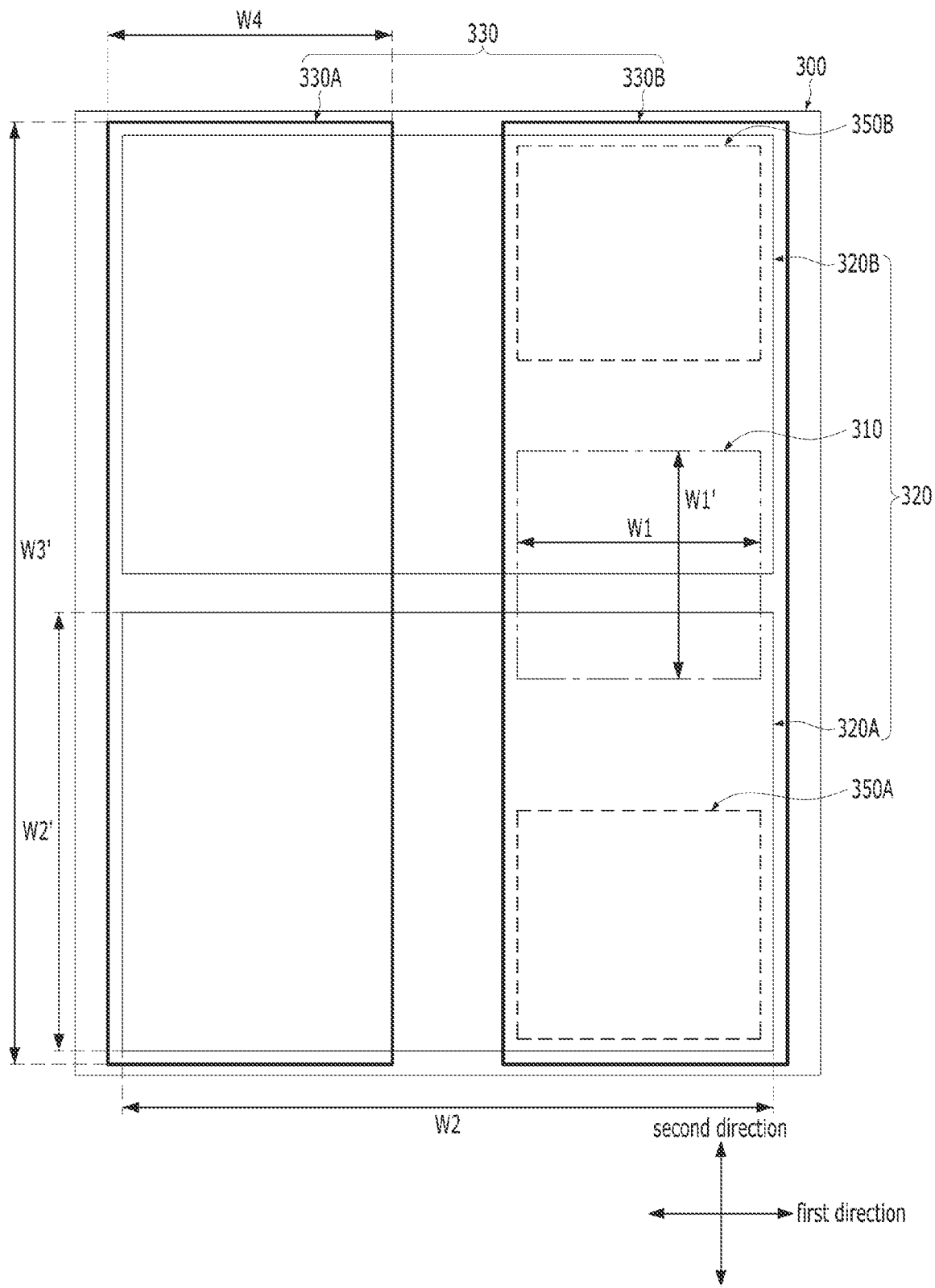
FIG. 3C is another plan view of FIG. 3A viewed from above.

FIG. 3C is another plan view of FIG. 3A viewed from above. For convenience of description, FIG. 3C shows a planar shape and arrangement of the substrate 300, the first semiconductor chip 310, the second semiconductor chip stack 320 including the first one-side second semiconductor chip stack 320A and the second one-side second semiconductor chip stack 320B, the third semiconductor chip stack 330 including the first one-side third semiconductor chip stack 330A and the second one-side third semiconductor chip stack 330B, and first and second dummy semiconductor chips 350A and 350B.

Referring to FIGS. 3A and 3C, the first semiconductor chip 310 may have a width that corresponds to W1 in the first direction and a width that corresponds to W1' in the second direction. The second semiconductor chip stack 320 may have a width that corresponds to W2 in the first direction and a width that corresponds to W2' in the second direction. The third semiconductor chip stack 330 may have a width that corresponds to W4 in the first direction and a width that corresponds to W3' in the second direction.

The width W4 of the third semiconductor chip stack 330 may be less than the width W2 of the second semiconductor chip stack 320 in the first direction, while the width W3' of the third semiconductor chip stack 330 may be greater than the width W2' of the second semiconductor chip stack 320 in the second direction. The first semiconductor chip 310 may be a chip having a smaller planar area than the second semiconductor chip stack 320 and the third semiconductor chip stack 330, and thus, the width W1 of the first semiconductor chip 310 may be less than the width W2 of the second semiconductor chip stack 320 in the first direction, and the width W1' of the first semiconductor chip 310 may be greater than the width W3' of the third semiconductor chip stack 330 in the second direction.

In the present embodiment, in the first direction, the second semiconductor chip stack 320 may overlap with the entire upper surface of the first one-side third semiconductor chip stack 330A and the entire upper surface of the first semiconductor chip 310. Accordingly, the second semiconductor chip stack 320 may be sufficiently supported by the first one-side third semiconductor chip stack 330A and the first semiconductor chip 310 in the first direction. In addition, because the first one-side third semiconductor chip stack 330A has a relatively large width W3' in the second direction, the second semiconductor chip stack 320, in particular, the first one-side and the second one-side second semiconductor chip stacks 320A and 320B arranged in the second direction may be supported by the first one-side third semiconductor chip stack 330A. However, because the first semiconductor chip 310 has a relatively small width W1' in the second direction, it may be difficult to support the second semiconductor chip stack 320, in particular, the first one-side and the second one-side second semiconductor chip stacks 320A and 320B that are arranged in the second direction. In order to solve this difficulty, the dummy semiconductor chips 350A and 350B may be disposed in an empty space between the substrate 300 and the second semiconductor chip stack 320 and may be disposed to be adjacent to the first one-side third semiconductor chip stack 330A and the first semiconductor chip 310. In the present embodiment, a case in which the first and second dummy semiconductor chips 350A and 350B are disposed on both sides of the first semiconductor chip 310, respectively, in the second direction is illustrated. However, the present disclosure is not limited thereto, and the planar size, position, and number of the dummy semiconductor chip may be variously modified.

Although not shown in the cross-sectional view of FIG. 3A, the dummy semiconductor chips 350A and 350B may be disposed between the substrate 300 and the second semiconductor chip stack 320 and may have a thickness that is substantially the same as the thickness of the first one-side third semiconductor chip stack 330A or the total thickness of the first semiconductor chip 310 and the connection electrode 312. When the dummy semiconductor chips 350A and 350B are attached to the substrate 300 by an adhesive layer (not shown), the sum of the thickness of each of the dummy semiconductor chips 350A and 350B and the thickness of the adhesive layer may be the same as the thickness of the first one-side third semiconductor chip stack 330A or the total thickness of the first semiconductor chip 310 and the connection electrode 312.

Figure 4A:
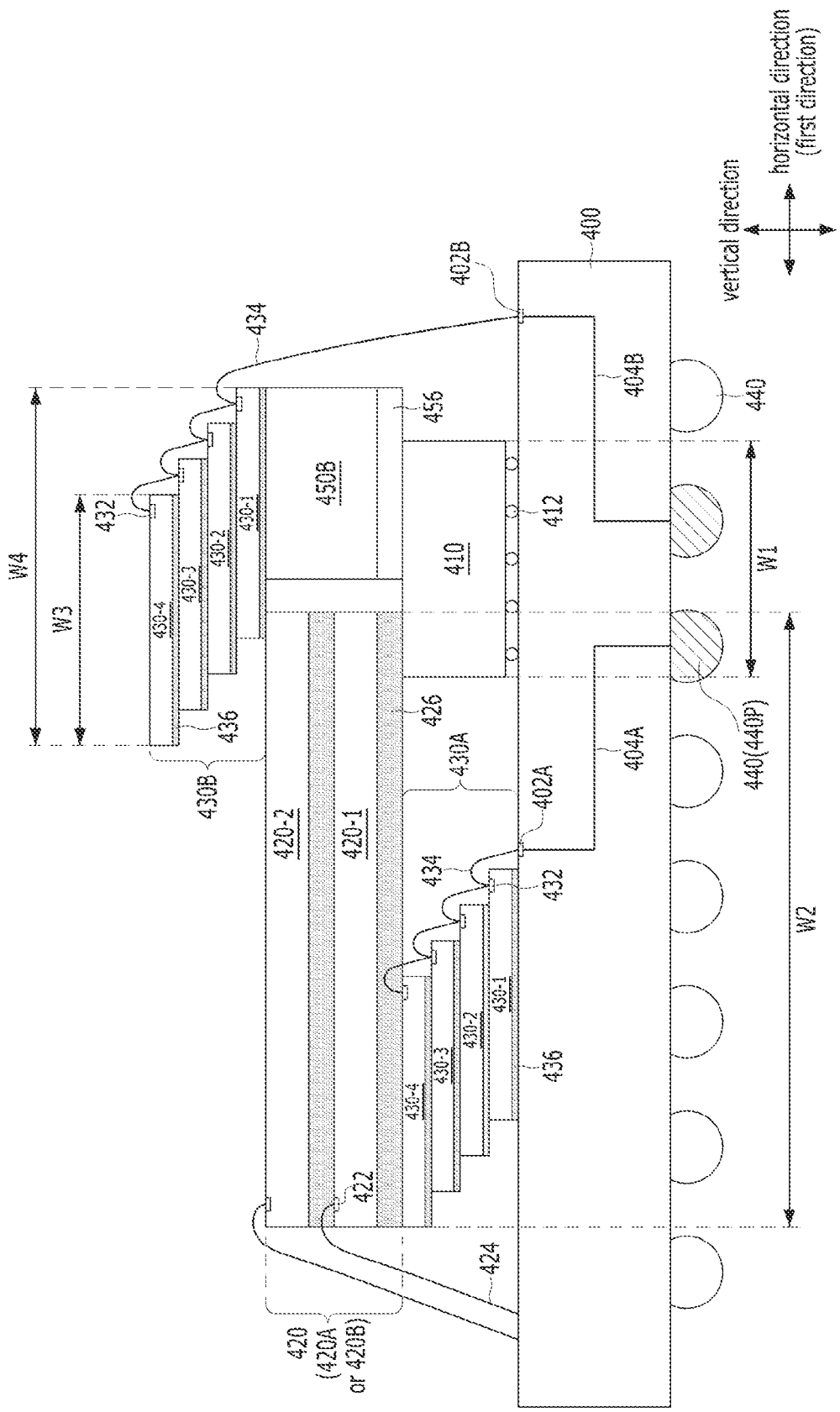
FIG. 4A is a cross-sectional view illustrating a semiconductor package according to another embodiment of the present disclosure.
Figure 4B:
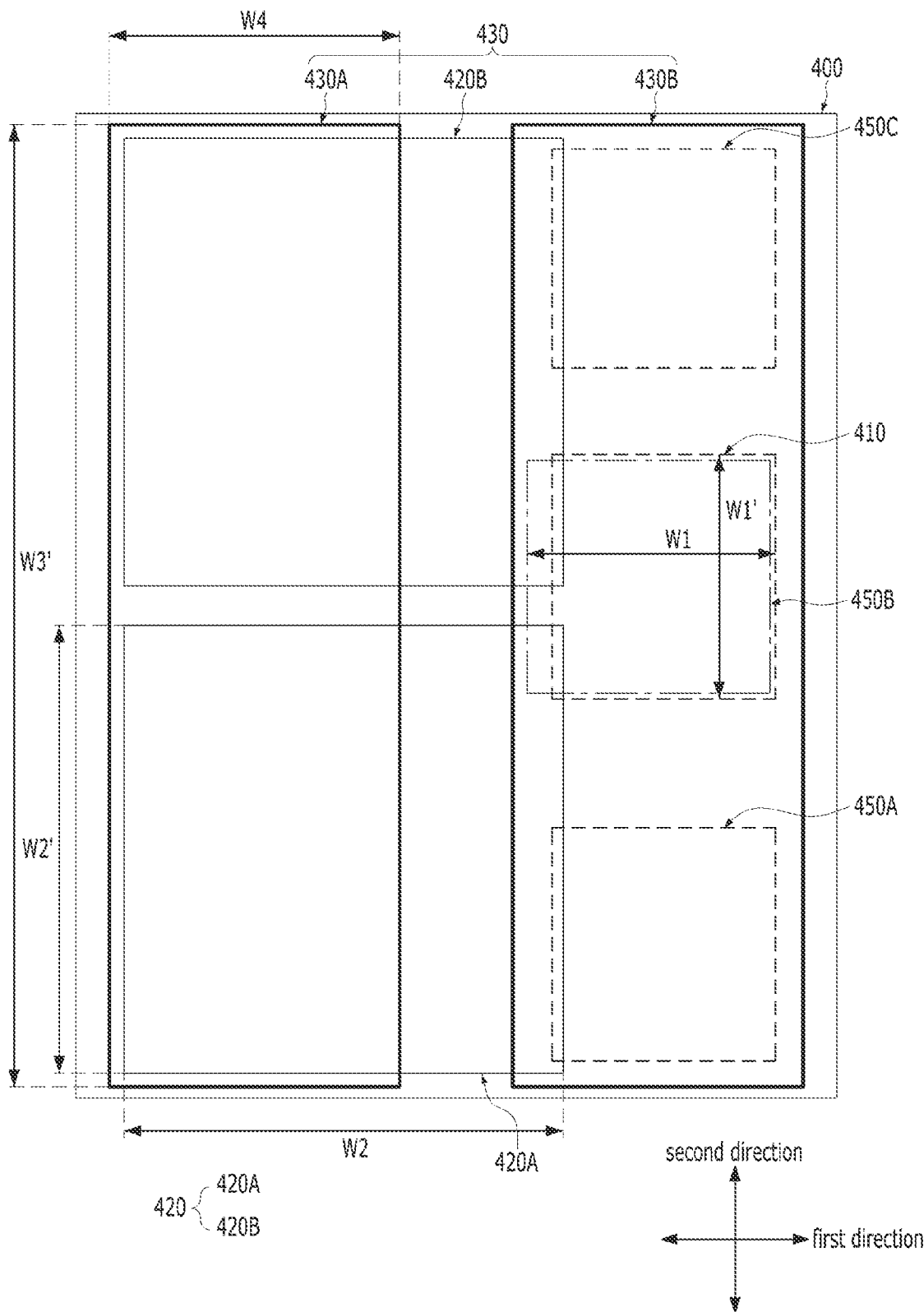
FIG. 4B is a plan view of FIG. 4A viewed from above.

FIG. 4A is a cross-sectional view illustrating a semiconductor package according to another embodiment of the present disclosure, and FIG. 4B is a plan view of FIG. 4A viewed from above, in a manner similar to that of FIG. 3C.

Differences from the above-described embodiment of FIGS. 3A to 3C will be mainly described.

Referring to FIGS. 4A and 4B, the semiconductor package of the present embodiment may include a substrate 400, a first semiconductor chip 410, a second semiconductor chip stack 420, a third semiconductor chip stack 430 including a first one-side third semiconductor chip stack 430A and a second one-side third semiconductor chip stack 430B, and external connection electrodes 440 including power connection electrodes 440P.

The substrate 400 may include a first one-side upper substrate pad 402A for supplying power to the first one-side third semiconductor chip stack 430A and a second one-side upper substrate pad 402B for supplying power to the second one-side third semiconductor chip stack 430B. Also, the substrate 400 may include a first one-side wiring structure 404A that is connected from the first one-side upper substrate pad 402A to a first corresponding power connection electrode, among the power connection electrodes 440P, and a second one-side wiring structure 404B connected from the second one-side upper substrate pad 402B to a second corresponding power connection electrode, among the power connection electrodes 440P.

The first semiconductor chip 410 may be disposed over the upper surface of the substrate 400 and may be connected to the substrate 400 by a connection electrode 412 that is formed on the lower surface of the first semiconductor chip 410. The first semiconductor chip 410 may be disposed to be relatively biased toward the second side, for example, to the right side in the first direction.

The second semiconductor chip stack 420 may be disposed over the first semiconductor chip 410 and the first one-side third semiconductor chip stack 430A. The second semiconductor chip stack 420 may include one or more second semiconductor chips 420-1 and 420-2 that are stacked in the vertical direction. Each of the second semiconductor chips 420-1 and 420-2 may be attached to the upper surface of a component that is positioned directly thereunder through an adhesive layer 426 that is formed over the inactive surface thereof. The second semiconductor chips 420-1 and 420-2 may be electrically connected to the substrate 400 through a bonding wire 424 that is connected to the chip pad 422. The second semiconductor chip stack 420 may include a first one-side second semiconductor chip stack 420A and a second one-side second semiconductor chip stack 420B, which are arranged to be spaced apart from each other in the second direction.

The first one-side third semiconductor chip stack 430A of the third semiconductor chip stack 430 may be disposed between the substrate 400 and the second semiconductor chip stack 420 in the vertical direction. The first one-side third semiconductor chip stack 430A may be disposed to be spaced apart from the first semiconductor chip 410 on a first side, for example, on the left side of the first semiconductor chip 410 in the first direction.

On the other hand, the second one-side third semiconductor chip stack 430B of the third semiconductor chip stack 430 may be disposed over the second semiconductor chip stack 420. In the first direction, the second one-side third semiconductor chip stack 430B may be disposed to be closer to the second side of the substrate 400 than the first one-side third semiconductor chip stack 430A. As an example, the second one-side third semiconductor chip stack 430B may be disposed to overlap with the first semiconductor chip 410.

Each of the first one-side and the second one-side third semiconductor chip stacks 430A and 430B may include one or more third semiconductor chips 430-1 to 430-4, stacked in the vertical direction. The third semiconductor chips 430-1 to 430-4 may be stacked in a state in which an active surface on which a chip pad 432 is disposed faces upward and an inactive surface faces downward, that is, in a face-up state. In addition, the chip pad 432 of the first one-side and the second one-side third semiconductor chip stacks 430A and 430B may be disposed on a second one-side edge region, for example, a right edge region of each of the third semiconductor chips 430-1 to 430-4 in the first direction. The third semiconductor chips 430-1 to 430-4 of the first one-side and the second one-side third semiconductor chip stacks 430A and 430B may be offset-stacked in a direction from the second side toward the first side so that all of the chip pads 432 are exposed. The first one-side and the second one-side third semiconductor chip stacks 430A and 430B may be electrically connected to the first one-side and the second one-side upper substrate pads 402A and 402B of the substrate 400, respectively, through a bonding wire 434. Each of the third semiconductor chips 430-1 to 430-4 may be attached to a component that is positioned directly thereunder through an adhesive layer 436 formed over the inactive surface thereof.

In the present embodiment, the width W2 of the second semiconductor chip stack 420 in the first direction may be reduced compared to the above-described embodiment. Accordingly, in the first direction, the second semiconductor chip stack 420 may partially overlap with the upper surface of the first semiconductor chip 410 while overlapping with the entire upper surface of the first one-side third semiconductor chip stack 430A.

In this case, if the second one-side third semiconductor chip stack 430B exists at the same position as in the above-described embodiment, it may be difficult that the second semiconductor chip stack 420 supports the second one-side third semiconductor chip stack 430B in the first direction. Accordingly, first to third dummy semiconductor chips 450A, 450B, and 450C for sufficient support of the second one-side third semiconductor chip stack 430B may be disposed.

The second dummy semiconductor chip 450B, among the first to third dummy semiconductor chips 450A, 450B, and 450C, may be disposed between the first semiconductor chip 410 and the second one-side third semiconductor chip stack 430B in the vertical direction. That is, the second dummy semiconductor chip 450B may be positioned at the same level as the second semiconductor chip stack 420 in the vertical direction. When the second dummy semiconductor chip 450B is attached to the upper surface of the first semiconductor chip 410 by an adhesive layer 456 that is formed on its lower surface, the sum of the thickness of the second dummy semiconductor chip 450B and the thickness of the adhesive layer 456 may be substantially the same as the thickness of the second semiconductor chip stack 420. If the adhesive layer 456 is omitted, the thickness of the second dummy semiconductor chip 450B may be substantially the same as the thickness of the second semiconductor chip stack 420.

The first and third dummy semiconductor chips 450A and 450C may be disposed between the substrate 400 and the second one-side third semiconductor chip stack 430B. As described above, because the width W1' of the first semiconductor chip 410 in the second direction is relatively small, the support of the second one-side third semiconductor chip stack 430B in the second direction might not be sufficient with the first semiconductor chip 410 and the second dummy semiconductor chip 450B. Accordingly, the first and third dummy semiconductor chips 450A and 450C may be further disposed in an empty space that is under the second one-side third semiconductor chip stack 430B. In the present embodiment, a case has been described in which the first and third dummy semiconductor chips 450A and 450C are disposed on both sides of the second dummy semiconductor chip 450B, respectively, in the second direction, but the present disclosure is not limited thereto. The size, position, and number of dummy semiconductor chips having thicknesses that correspond to that of each of the first and third dummy semiconductor chips 450A and 450C may be variously modified.

Each of the first and third dummy semiconductor chips 450A and 450C may have a thickness substantially the same as the sum of the thickness of the first one-side third semiconductor chip stack 430A and the thickness of the second semiconductor chip stack 420. When each of the first and third dummy semiconductor chips 450A and 450C is attached to the upper surface of the substrate 400 by an adhesive layer (not shown), the sum of the thicknesses of the adhesive layer and the thickness of each of the first and third dummy semiconductor chips 450A and 450C may be substantially the same as the sum of the thickness of the first one-side third semiconductor chip stack 430A and the thickness of the second semiconductor chip stack 420.

Figure 5A:
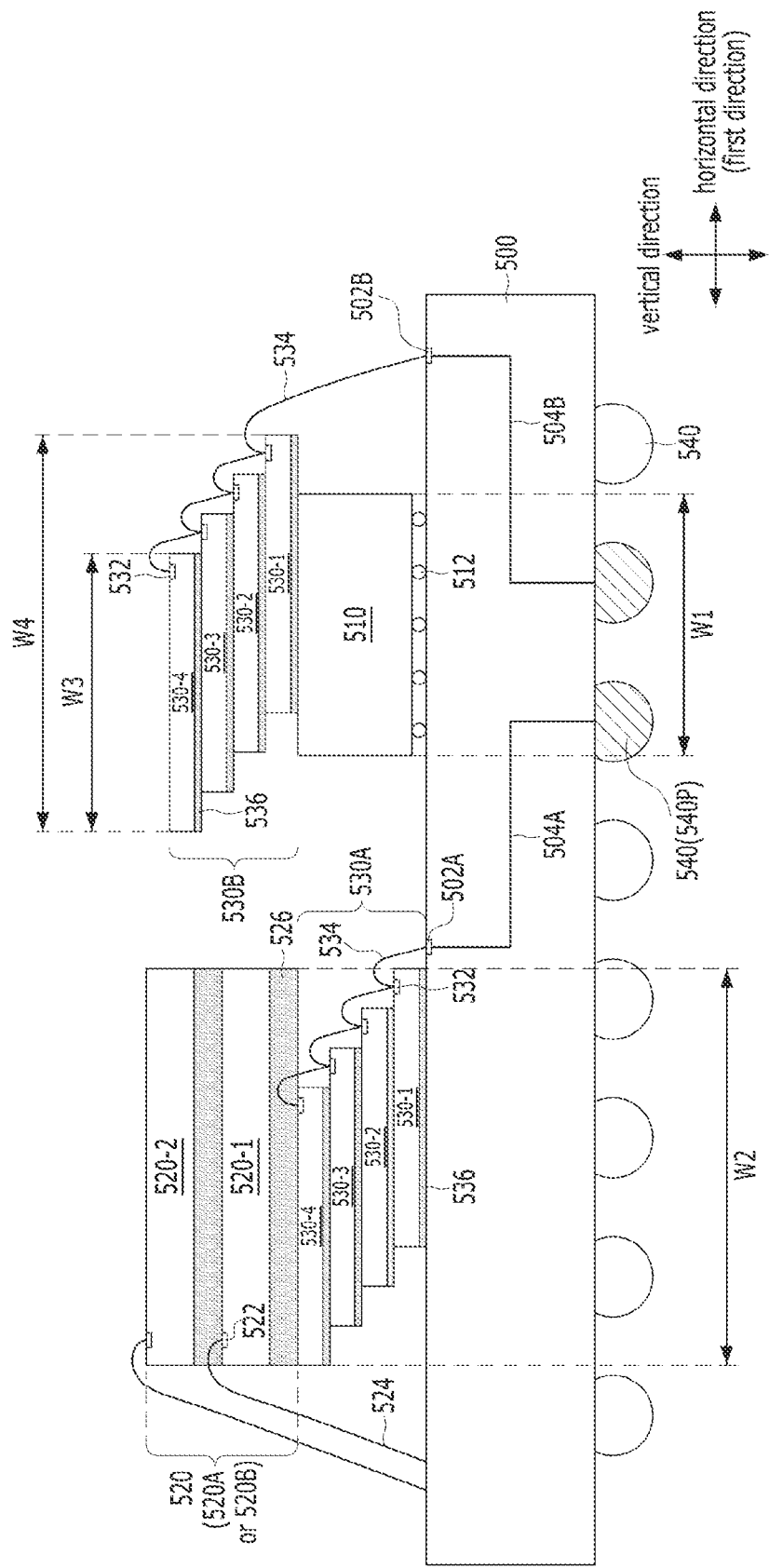
FIG. 5A is a cross-sectional view illustrating a semiconductor package according to another embodiment of the present disclosure.
Figure 5B:
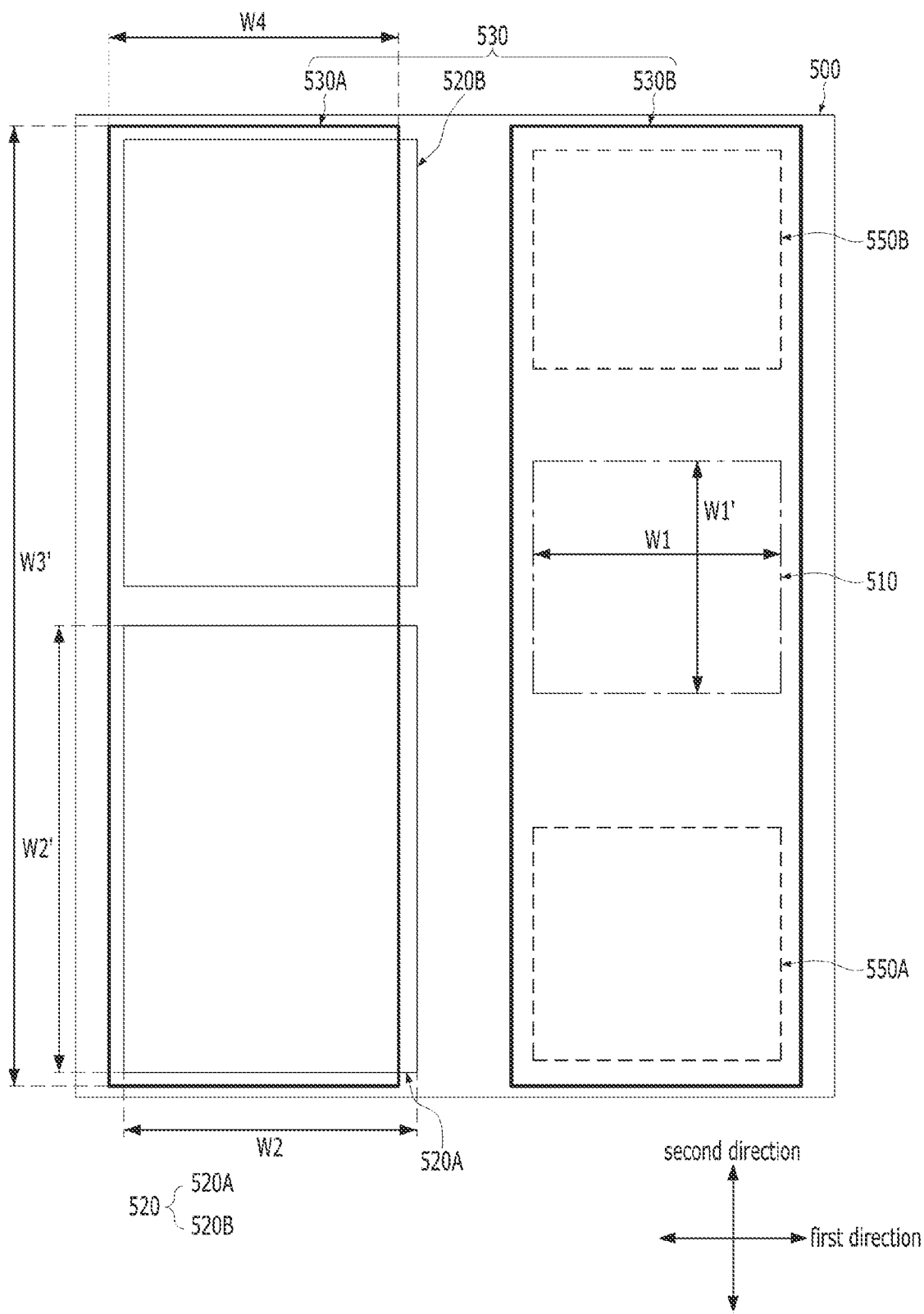
FIG. 5B is a plan view of FIG. 5A viewed from above.

FIG. 5A is a cross-sectional view illustrating a semiconductor package according to another embodiment of the present disclosure, and FIG. 5B is a plan view of FIG. 5A viewed from above, in a manner similar to those of FIGS. 3C and 4B. Differences from the above-described embodiments of FIGS. 3A to 3C, and FIGS. 4A and 4B will be mainly described.

Referring to FIGS. 5A and 5B, the semiconductor package of the present embodiment may include a substrate 500, a first semiconductor chip 510, a second semiconductor chip stack 520, a third semiconductor chip stack 530 including a first one-side third semiconductor chip stack 530A and a second one-side third semiconductor chip stack 530B, and external connection electrodes 540 including power connection electrodes 540P.

The substrate 500 may include a first one-side upper substrate pad 502A for supplying power to the first one-side third semiconductor chip stack 530A and a second one-side upper substrate pad 502B for supplying power to the second one-side third semiconductor chip stack 530B. Also, the substrate 500 may include a first one-side wiring structure 504A that is connected from the first one-side upper substrate pad 502A to a first corresponding power connection electrode, among the power connection electrodes 540P, and a second one-side wiring structure 504B connected from the second one-side upper substrate pad 502B to a second corresponding power connection electrode, among the power connection electrodes 540P.

The first semiconductor chip 510 may be disposed over the upper surface of the substrate 500 and may be connected to the substrate 500 by a connection electrode 512 that is formed on the lower surface of the first semiconductor chip 510. The first semiconductor chip 510 may be disposed to be relatively biased toward the second side, for example, to the right side in the first direction.

The second semiconductor chip stack 520 may be disposed over the first one-side third semiconductor chip stack 530A. The second semiconductor chip stack 520 may include one or more second semiconductor chips 5204 and 520-2, stacked in the vertical direction. Each of the second semiconductor chips 520-1 and 520-2 may be attached to a component that is positioned directly thereunder through an adhesive layer 526 that is formed over the inactive surface thereof. The second semiconductor chips 520-1 and 520-2 may be electrically connected to the substrate 500 through a bonding wire 524 that is connected to the chip pad 522. The second semiconductor chip stack 520 may include a first one-side second semiconductor chip stack 520A and a second one-side second semiconductor chip stack 520B, which are arranged to be spaced apart from each other in the second direction.

The first one-side third semiconductor chip stack 530A of the third semiconductor chip stack 530 may be disposed between the substrate 500 and the second semiconductor chip stack 520 in the vertical direction. The first one-side third semiconductor chip stack 530A may be disposed to be spaced apart from the first semiconductor chip 510 on a first side, for example, on the left side of the first semiconductor chip 510 in the first direction.

The second one-side third semiconductor chip stack 530B of the third semiconductor chip stack 530 may be disposed over the first semiconductor chip 510. The second one-side third semiconductor chip stack 530B may directly contact the first semiconductor chip 510. That is, unlike the above-described embodiments, the second semiconductor chip stack 520 might not be interposed between the second one-side third semiconductor chip stack 530B and the first semiconductor chip 510.

Each of the first one-side and the second one-side third semiconductor chip stacks 530A and 530B may include one or more third semiconductor chips 530-1 to 530-4, stacked in the vertical direction. The third semiconductor chips 530-1 to 530-4 may be stacked in a state in which an active surface on which a chip pad 532 is disposed faces upward and an inactive surface faces downward, that is, in a face-up state. In addition, the chip pad 532 of the first one-side and the second one-side third semiconductor chip stacks 530A and 530B may be disposed on a second one-side edge region, for example, a right edge region of each of the third semiconductor chips 530-1 to 530-4 in the first direction. The third semiconductor chips 530-1 to 530-4 of the first one-side and the second one-side third semiconductor chip stacks 530A and 530B may be offset-stacked in a direction from the second side toward the first side so that all of the chip pads 532 are exposed. The first one-side and the second one-side third semiconductor chip stacks 530A and 530B may be electrically connected to the first one-side and the second one-side upper substrate pads 502A and 502B of the substrate 500, respectively, through a bonding wire 534. Each of the third semiconductor chips 530-1 to 530-4 may be attached to a component that is positioned directly thereunder through an adhesive layer 536 that is formed over the inactive surface thereof.

In the present embodiment, the width W2 of the second semiconductor chip stack 520 in the first direction may be further reduced compared to the above-described embodiments. Accordingly, in the first direction, the second semiconductor chip stack 520 might not overlap with the upper surface of the first semiconductor chip 510 and may be spaced apart from the first semiconductor chip 510 while overlapping with the entire upper surface of the first one-side third semiconductor chip stack 530A.

In this case, because the second one-side third semiconductor chip stack 530B also does not overlap with the second semiconductor chip stack 520, it may be formed over the first semiconductor chip 510 to directly contact the first semiconductor chip 510. However, because the width W3' of the second one-side third semiconductor chip stack 530B in the second direction is greater than the width W1' of the first semiconductor chip 510, first and second dummy semiconductor chips 550A and 550B may be disposed for sufficiently supporting the second one-side third semiconductor chip stack 530B.

The first and second dummy semiconductor chips 550A and 550B may be disposed between the substrate 500 and the second one-side third semiconductor chip stack 530B. Although not shown in the cross-sectional view of FIG. 5A, when each of the first and second dummy semiconductor chips 550A and 550B is attached to the upper surface of the substrate 500 by an adhesive layer (not shown) formed on the lower surface thereof, the sum of the thickness of the adhesive layer and the thickness of each of the first and second dummy semiconductor chips 550A and 550B may be substantially the same as the sum of the thickness of the first semiconductor chip 510 and the thickness of the connection electrode 512. If the adhesive layer is omitted, the thickness of each of the first and second dummy semiconductor chips 550A and 550B may be substantially the same as the sum of the thickness of the first semiconductor chip 510 and the thickness of the connection electrode 512.

Figure 6:
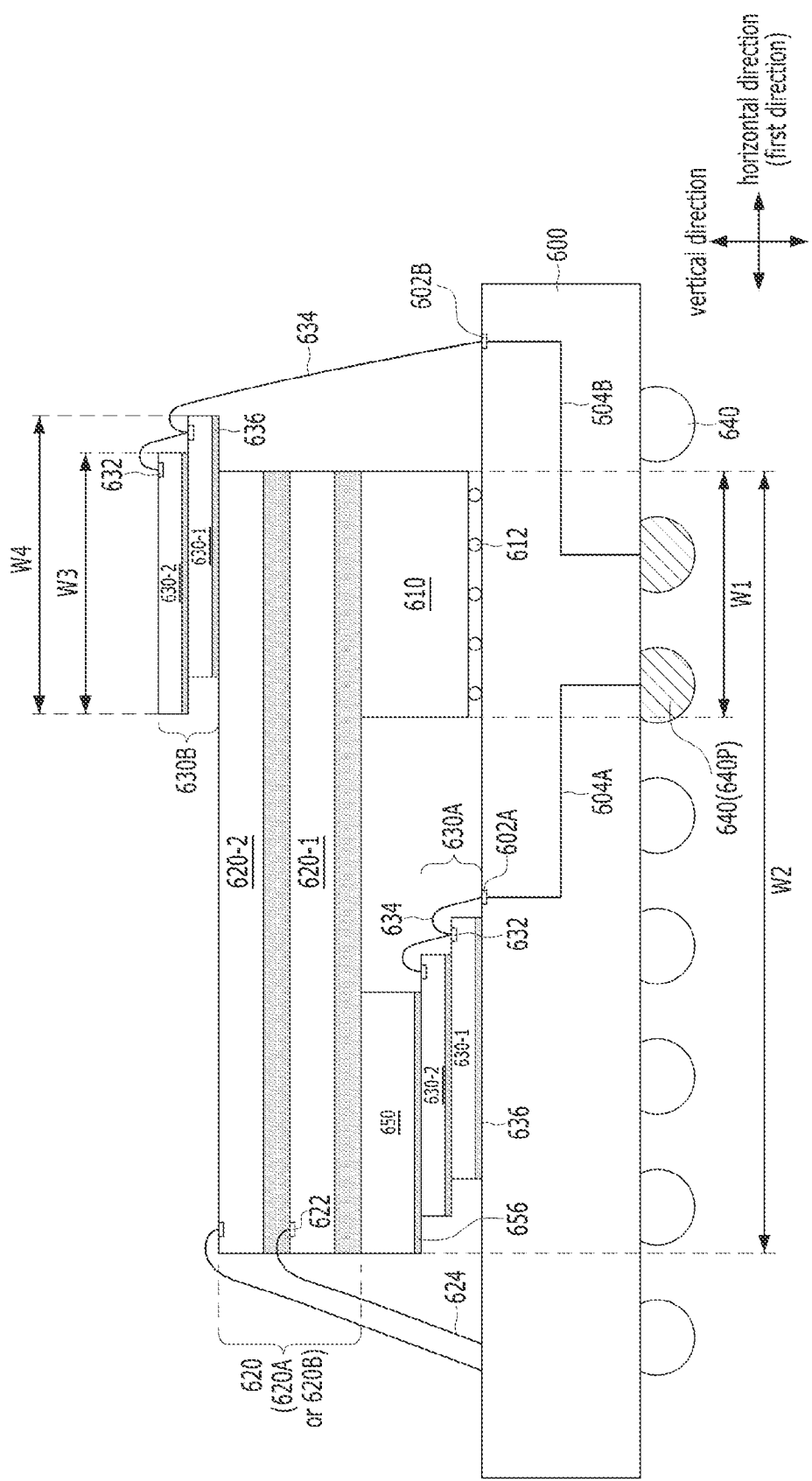
FIG. 6 is a cross-sectional view illustrating a semiconductor package according to another embodiment of the present disclosure.

FIG. 6 is a cross-sectional view illustrating a semiconductor package according to another embodiment of the present disclosure. A plan view of FIG. 6 is omitted because it is substantially the same as FIG. 3C described above. Differences from the above-described embodiment of FIGS. 3A to 3C will be mainly described.

Referring to FIG. 6, the semiconductor package of the present embodiment may include a substrate 600, a first semiconductor chip 610, a second semiconductor chip stack 620, a third semiconductor chip stack 630 including a first one-side third semiconductor chip stack 630A and a second one-side third semiconductor chip stack 630B, and external connection electrodes 640 including power connection electrodes 640P.

The substrate 600 may include a first one-side upper substrate pad 602A for supplying power to the first one-side third semiconductor chip stack 630A and a second one-side upper substrate pad 602B for supplying power to the second one-side third semiconductor chip stack 630B. Also, the substrate 600 may include a first one-side wiring structure 604A that is connected from the first one-side upper substrate pad 602A to a first corresponding power connection electrode, among the power connection electrodes 640P, and a second one-side wiring structure 604B that is connected from the second one-side upper substrate pad 602B to a second corresponding power connection electrode, among the power connection electrodes 640P.

The first semiconductor chip 610 may be disposed over the upper surface of the substrate 600 and may be connected to the substrate 600 by a connection electrode 612 that is formed on the lower surface of the first semiconductor chip 610. The first semiconductor chip 610 may be disposed to be relatively biased toward the second side, for example, to the right side in the first direction.

The second semiconductor chip stack 620 may be disposed over the first semiconductor chip 610 and the first one-side third semiconductor chip stack 630A. The second semiconductor chip stack 620 may include one or more second semiconductor chips 620-1 and 620-2, stacked in the vertical direction. Each of the second semiconductor chips 6204 and 620-2 may be attached to a component that is positioned directly thereunder through an adhesive layer 626 that is formed over the inactive surface thereof. The second semiconductor chips 620-1 and 620-2 may be electrically connected to the substrate 600 through a bonding wire 624 that is connected to the chip pad 622.

The first one-side third semiconductor chip stack 630A of the third semiconductor chip stack 630 may be disposed between the substrate 600 and the second semiconductor chip stack 620 in the vertical direction. The first one-side third semiconductor chip stack 630A may be disposed to be spaced apart from the first semiconductor chip 610 on a first side, for example, on the left side of the first semiconductor chip 610 in the first direction. In this case, the thickness of the first one-side third semiconductor chip stack 630A may be less than the total thickness of the first semiconductor chip 610 and the connection electrode 612. Accordingly, in the vertical direction, the upper surface of the first one-side third semiconductor chip stack 630A may be located below the upper surface of the first semiconductor chip 610. In this case, because it is difficult to form the second semiconductor chip stack 620, a dummy semiconductor chip 650 may be disposed between the first one-side third semiconductor chip stack 630A and the second semiconductor chip stack 620. The dummy semiconductor chip 650 may be attached to the upper surface of the first one-side third semiconductor chip stack 630A by an adhesive layer 656.

The second one-side third semiconductor chip stack 630B of the third semiconductor chip stack 630 may be disposed over the second semiconductor chip stack 620.

Each of the first one-side and the second one-side third semiconductor chip stacks 630A and 630B may include one or more third semiconductor chips 630-1 and 630-2, stacked in the vertical direction. In the present embodiment, because each of the first one-side and the second one-side third semiconductor chip stacks 630A and 630B includes two third semiconductor chips 630-1 and 630-2, the thickness thereof may be less than that of the above-described embodiment. The third semiconductor chips 630-1 and 630-2 may be stacked in a state in which an active surface on which a chip pad 632 is disposed faces upward and an inactive surface faces downward, that is, in a face-up state. In addition, the chip pad 632 of the first one-side and the second one-side third semiconductor chip stacks 630A and 630B may be disposed on a second one-side edge region, for example, a right edge region of each of the third semiconductor chips 630-1 and 630-2 in the first direction. The third semiconductor chips 630-1 and 630-2 of the first one-side and the second one-side third semiconductor chip stacks 630A and 630B may be offset-stacked in a direction from the second side toward the first side so that all of the chip pads 632 are exposed. The first one-side and the second one-side third semiconductor chip stacks 630A and 630B may be electrically connected to the first one-side and the second one-side upper substrate pads 602A and 602B of the substrate 600, respectively, through a bonding wire 634. Each of the third semiconductor chips 630-1 and 630-2 may be attached to a component positioned directly thereunder through an adhesive layer 636 that is formed over the inactive surface thereof.

According to the above embodiments of the present disclosure, it may be possible to provide a semiconductor package capable of reducing the area and thickness of the semiconductor package as much as possible while integrating different types of memories and controllers into one package and securing excellent operating characteristics.

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
a substrate having a first side and a second side, the first and second sides being on opposite sides of the substrate in a first direction;
a first semiconductor chip disposed over the substrate;
a first one-side third semiconductor chip stack disposed over the substrate and spaced apart from the first semiconductor chip, the first one-side third semiconductor chip stack being closer to the first side than the first semiconductor chip;
a second semiconductor chip stack disposed over the first semiconductor chip and the first one-side third semiconductor chip stack, the second semiconductor chip stack including at least two second semiconductor chips; and
a second one-side third semiconductor chip stack disposed over the second semiconductor chip stack;
wherein each of the first one-side third semiconductor chip stack and the second one-side third semiconductor chip stack includes a plurality of third semiconductor chips that are offset-stacked, offset towards the first side as the plurality of third semiconductor chips are farther from the substrate, so that chip pads that are disposed on other-side edge regions of the plurality of the third semiconductor chips are exposed;
wherein each of the first one-side third semiconductor chip stack and the second one-side third semiconductor chip stack is electrically connected to the substrate through a bonding wire that extends to the substrate while connecting the chip pads of the plurality of third semiconductor chips to each other;
wherein the second semiconductor chip stack includes a volatile memory;
wherein each of the first one-side third semiconductor chip stack and the second one-side third semiconductor chip stack includes a non-volatile memory; and
wherein the first semiconductor chip includes a memory controller.

2. The semiconductor package according to claim 1, further comprising:
a plurality of power connection electrodes disposed under the substrate that are for supplying power to the first one-side third semiconductor chip stack and the second one-side third semiconductor chip stack,
wherein the plurality of power connection electrodes are closer to the second side of the substrate than to the first side of the substrate.

3. The semiconductor package according to claim 2, wherein the substrate further comprises:
a first one-side wiring structure connecting the bonding wire that is connected to the first one-side third semiconductor chip stack to a first corresponding power connection electrode, among the plurality of power connection electrodes; and
a second one-side wiring structure connecting the bonding wire that is connected to the second one-side third semiconductor chip stack to a second corresponding power connection electrode, among the plurality of power connection electrodes.

4. The semiconductor package according to claim 1, further comprising:
a dummy semiconductor chip disposed in a space between the substrate and the second semiconductor chip stack and disposed to be adjacent to the first one-side third semiconductor chip stack and the first semiconductor chip.

5. The semiconductor package according to claim 1, wherein the second semiconductor chip stack partially overlaps with the first semiconductor chip and the second one-side third semiconductor chip stack to provide a first space between the first semiconductor chip and the second one-side third semiconductor chip stack in a vertical direction, and
wherein the semiconductor package further comprises a first dummy semiconductor chip disposed in the first space.

6. The semiconductor package according to claim 5, further comprising:
a second dummy semiconductor chip disposed in a second space between the substrate and the second one-side third semiconductor chip stack in the vertical direction and is adjacent to the first semiconductor chip and the second semiconductor chip stack.

7. The semiconductor package according to claim 6, wherein a thickness of the second dummy semiconductor chip is greater than a thickness of the first dummy semiconductor chip.

8. The semiconductor package according to claim 1, wherein, in a vertical direction, an upper surface of the first semiconductor chip and an upper surface of the first one-side third semiconductor chip stack are positioned at the same level.

9. The semiconductor package according to claim 1, wherein, in a vertical direction, an upper surface of the first one-side third semiconductor chip stack is positioned below an upper surface of the first semiconductor chip.

10. The semiconductor package according to claim 9, further comprising:
a dummy semiconductor chip disposed over the first one-side third semiconductor chip stack,
wherein an upper surface of the dummy semiconductor chip and the upper surface of the first semiconductor chip are positioned at the same level in the vertical direction.

11. The semiconductor package according to claim 1, wherein, in the first direction, a width of the second semiconductor chip stack is greater than a width of the first semiconductor chip and a width of the first one-side third semiconductor chip stack.

12. The semiconductor package according to claim 11, wherein, in a second direction that is perpendicular to the first direction, a width of the second semiconductor chip stack is greater than a width of the first semiconductor chip and less than a width of each of the first one-side third semiconductor chip stack and the second one-side third semiconductor chip stack, and
wherein at least two second semiconductor chip stacks are arranged in the second direction.

13. A semiconductor package comprising:
a substrate having a first side and a second side, the first and second sides being on opposite sides of the substrate in a first direction;
a first semiconductor chip disposed over the substrate;
a first one-side third semiconductor chip stack disposed over the substrate and spaced apart from the first semiconductor chip, the first one-side third semiconductor chip stack being closer to the first side than the first semiconductor chip;
a second semiconductor chip stack disposed over the first one-side third semiconductor chip stack, the second semiconductor chip stack including at least two second semiconductor chips; and a second one-side third semiconductor chip stack disposed over the first semiconductor chip;
wherein each of the first one-side third semiconductor chip stack and the second one-side third semiconductor chip stack includes a plurality of third semiconductor chips that are offset-stacked, offset towards the first side as the plurality of third semiconductor chips are farther from the substrate, so that chip pads that are disposed on other-side edge regions of the plurality of the third semiconductor chips are exposed;
wherein each of the first one-side third semiconductor chip stack and the second one-side third semiconductor chip stack is electrically connected to the substrate through a bonding wire that extends to the substrate while connecting the chip pads of the plurality of third semiconductor chips to each other;
wherein the second semiconductor chip stack includes a volatile memory;
wherein each of the first one-side third semiconductor chip stack and the second one-side third semiconductor chip stack includes a non-volatile memory; and
wherein the first semiconductor chip includes a memory controller.

14. The semiconductor package according to claim 13, further comprising:
a plurality of power connection electrodes disposed under the substrate that are for supplying power to the first one-side third semiconductor chip stack and the second one-side third semiconductor chip stack,
wherein the plurality of power connection electrodes are closer to the second side of the substrate than to the first side of the substrate.

15. The semiconductor package according to claim 14, wherein the substrate further comprises:
a first one-side wiring structure connecting the bonding wire that is connected to the first one-side third semiconductor chip stack to a first corresponding power connection electrode, among the plurality of power connection electrodes; and
a second one-side wiring structure connecting the bonding wire that is connected to the second one-side third semiconductor chip stack to a second corresponding plurality of power connection electrode, among the plurality of power connection electrodes.

16. A semiconductor package comprising:
a substrate having a first side and a second side, the first and second sides being on opposite sides of the substrate in a first direction;
a first semiconductor chip disposed over the substrate;
a first one-side third semiconductor chip stack disposed over the substrate and spaced apart from the first semiconductor chip, the first one-side third semiconductor chip stack being closer to the first side than the first semiconductor chip;
a second semiconductor chip stack disposed over the first one-side third semiconductor chip stack, the second semiconductor chip stack including at least two second semiconductor chips; and
a second one-side third semiconductor chip stack disposed over the first semiconductor chip;
wherein each of the first one-side third semiconductor chip stack and the second one-side third semiconductor chip stack includes a plurality of third semiconductor chips that are offset-stacked, offset towards the first side as the plurality of third semiconductor chips are farther from the substrate, so that chip pads that are disposed on other-side edge regions of the plurality of the third semiconductor chips are exposed;
wherein each of the first one-side third semiconductor chip stack and the second one-side third semiconductor chip stack is electrically connected to the substrate through a bonding wire that extends to the substrate while connecting the chip pads of the plurality of third semiconductor chips to each other; and
wherein the second one-side third semiconductor chip stack is spaced apart from the second semiconductor chip stack in the first direction.

17. The semiconductor package according to claim 13, wherein the second one-side third semiconductor chip stack is in direct contact with an upper surface of the first semiconductor chip.

18. The semiconductor package according to claim 13, further comprising:
a dummy semiconductor chip disposed in a space between the substrate and the second one-side third semiconductor chip stack in a vertical direction and is adjacent to the first semiconductor chip.

* * * * *